(12) United States Patent
Cheng et al.

(10) Patent No.: US 10,273,148 B2
(45) Date of Patent: Apr. 30, 2019

(54) MICRO-ELECTRO-MECHANICAL SYSTEM AND MANUFACTURING METHOD THEREOF

(71) Applicant: TAIWAN SEMICONDUCTOR MANUFACTURING COMPANY LTD., Hsinchu (TW)

(72) Inventors: Chun-Wen Cheng, Hsinchu County (TW); Jung-Huei Peng, Hsinchu Hsien (TW); Chia-Hua Chu, Hsinchu County (TW); Nien-Tsung Tsai, Hsinchu (TW); Yao-Te Huang, Hsinchu (TW); Li-Min Hung, Taoyuan County (TW); Yu-Chia Liu, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/826,249

(22) Filed: Aug. 14, 2015

(65) Prior Publication Data

US 2017/0044004 A1 Feb. 16, 2017

(51) Int. Cl.
*H01L 29/84* (2006.01)
*H01L 21/02* (2006.01)
*B81B 7/00* (2006.01)

(52) U.S. Cl.
CPC ........ *B81B 7/0077* (2013.01); *B81B 2203/04* (2013.01); *B81B 2207/07* (2013.01)

(58) Field of Classification Search
CPC ............................... H01L 29/84; H01L 21/02
USPC ........... 257/254, 774, 684; 438/51, 424, 106
See application file for complete search history.

(56) References Cited

U.S. PATENT DOCUMENTS

| | | | |
|---|---|---|---|
| 6,028,331 A * | 2/2000 | Mastromatteo et al. ..... 257/253 |
| 2010/0176466 A1* | 7/2010 | Fujii ....................... B81B 7/007 |
| | | | 257/415 |
| 2011/0233621 A1* | 9/2011 | Liu et al. ...................... 257/254 |
| 2012/0049299 A1* | 3/2012 | Chou ........................... 257/417 |
| 2012/0074554 A1* | 3/2012 | Cheng et al. ................. 257/684 |
| 2013/0043510 A1* | 2/2013 | Shu et al. ..................... 257/254 |
| 2013/0214400 A1* | 8/2013 | Shu ....................... B81B 7/0038 |
| | | | 257/682 |
| 2013/0277777 A1* | 10/2013 | Chang ...................... B81B 7/00 |
| | | | 257/418 |
| 2014/0027927 A1* | 1/2014 | Reinmuth et al. ............ 257/774 |

\* cited by examiner

*Primary Examiner* — Sheng-Bai Zhu
(74) *Attorney, Agent, or Firm* — WPAT, P.C., Intellectual Property Attorneys; Anthony King

(57) ABSTRACT

Some embodiments of the present disclosure provide a microelectromechanical systems (MEMS). The MEMS includes a semiconductive block. The semiconductive block includes a protruding structure. The protruding structure includes a bottom surface. The semiconductive block includes a sensing structure. A semiconductive substrate includes a conductive region. The conductive region includes a first surface under the sensing structure. The first surface is substantially coplanar with the bottom surface. A dielectric region includes a second surface not disposed over the first surface.

19 Claims, 23 Drawing Sheets

MICRO-ELECTRO-MECHANICAL SYSTEM AND MANUFACTURING METHOD THEREOF

FIELD

The present disclosure relates to a Micro-Electro-Mechanical Systems (MEMS).

BACKGROUND

Micro-Electro-Mechanical Systems (MEMS) is a class of structures or devices fabricated using semiconductor-like operations and exhibiting mechanical characteristics such as an ability to move or deform. MEMS can interact with electrical signals to transmit a signal about a mechanical variation of the MEMS.

Silicon wafers contains MEMS structures are manufactured with various parameters suitable for different applications such as actuators, gyroscopes, accelerometers, magnetometers, pressure sensors, microphones, and radiofrequency components. Qualities of those devices depend on conditions of the manufacture or the designed parameters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
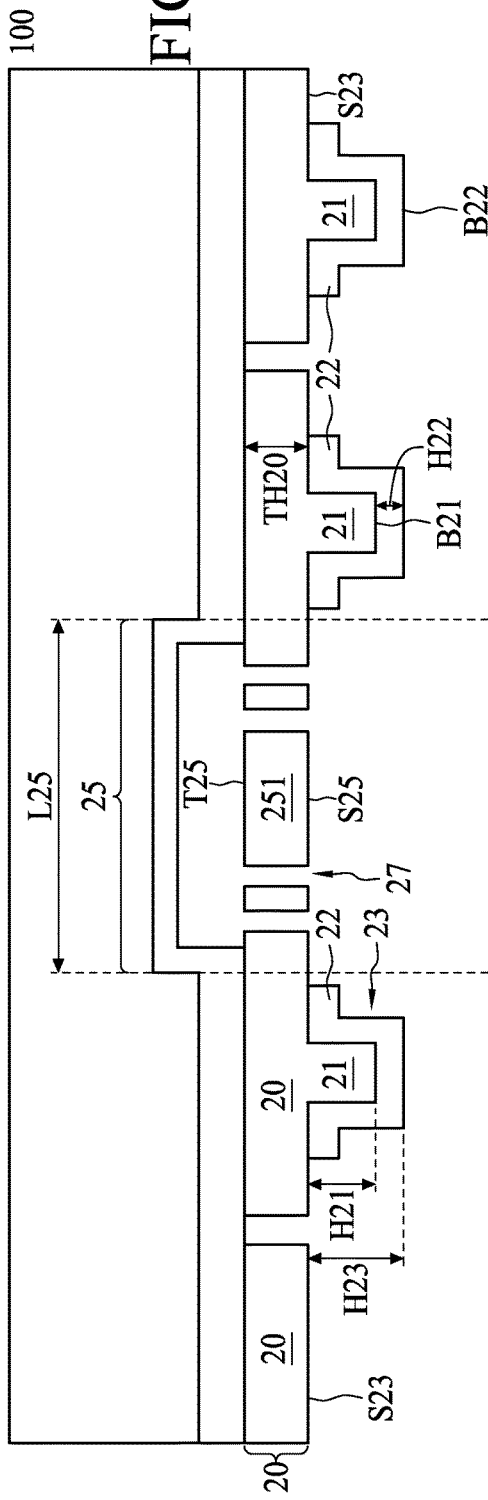
FIG. 1A is a cross-sectional view of a MEMS structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
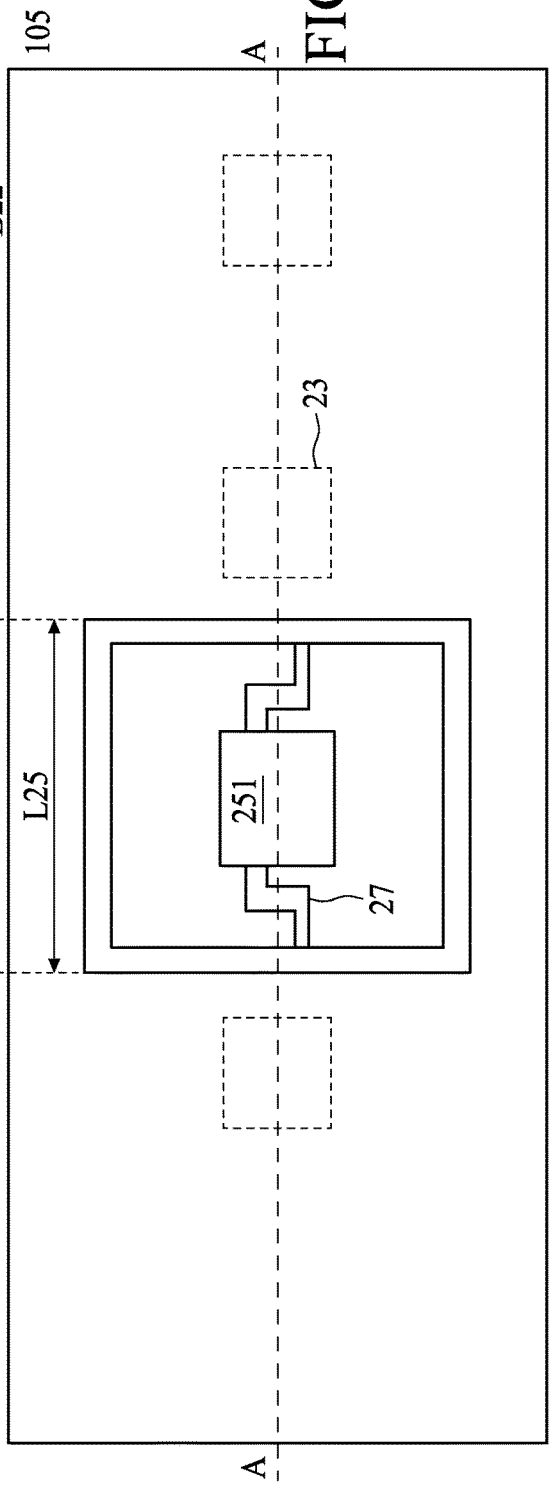
FIG. 1B is a top view of a MEMS structure, in accordance with some embodiments of the present disclosure.

In FIGS. 1A and 1B, a semiconductive block 100 is illustrated. FIG. 1A is a cross sectional view of the semiconductive block 100. FIG. 1B is a top view of the semiconductive block 100. The semiconductive block 100 includes a semiconductive layer 20, and a protruding structure 23 at a surface S23 of the semiconductive layer 20. The semiconductive block 100 includes a sensing structure 25.

The protruding structure 23 includes a protruding semiconductor 21 and a layer 22. The layer 22 is partially surrounding a lateral side and a bottom side B21 of the protruding semiconductor 21. The layer 22 can be an outer layer of the protruding structure 23 in contact with the protruding semiconductor 21, following a contour of the lateral side and the bottom side B21. The protruding semiconductor 21 includes a height H21 from the surface S23 to the bottom side B21. The layer 22 includes a height H22 from the bottom side B21 to a bottom side B22. The protruding structure 23 includes a height H23 from the surface S23 to the bottom side B22. The height H23 is a sum of the height H21 and the height H22. The height H23, H22, and H21 are measured along a direction orthogonal to the surface S23.

The sensing structure 25 is above the protruding structure 23. The sensing structure 25 includes a spring structure 27, a sensing piece 251, and the semiconductive layer 20. The sensing piece 251 in the sensing structure 25 includes the surface S25 at a bottom and a top side T25 at a top. In some embodiments, the sensing piece 251 includes a thickness substantially equal to a thickness TH20 of the semiconductive layer 20 from the surface S25 to the top side T25.

A spring structure 27 is in the sensing structure 25. In some embodiments, the surface S25 of the sensing piece 251 is substantially coplanar with the surface S23 of the semiconductive layer 20. The sensing structure 25 includes a length L25. The protruding structure 23 is outside of the sensing structure 25.

In FIG. 1B, a top view 105 of the semiconductive block 100 is illustrated. A cross sectional line AA is crossing through the sensing structure 25. The cross sectional view is illustrated aligned above the top view 105 in FIG. 1A. The sensing piece 251 is attached to the spring structure 27 in the sensing structure 25. The sensing piece 251 can move side way horizontally or up and down vertically in the sensing structure 25. In FIG. 1A, the surface S25 can be lower or higher than the surface S23 depending on the movement of the sensing piece 251.

In some embodiments, the semiconductive layer 20 and the protruding semiconductor 21 include a similar material such as silicon. The layer 22 includes material such as Tin (Sn) or Ge.

Figure 2:
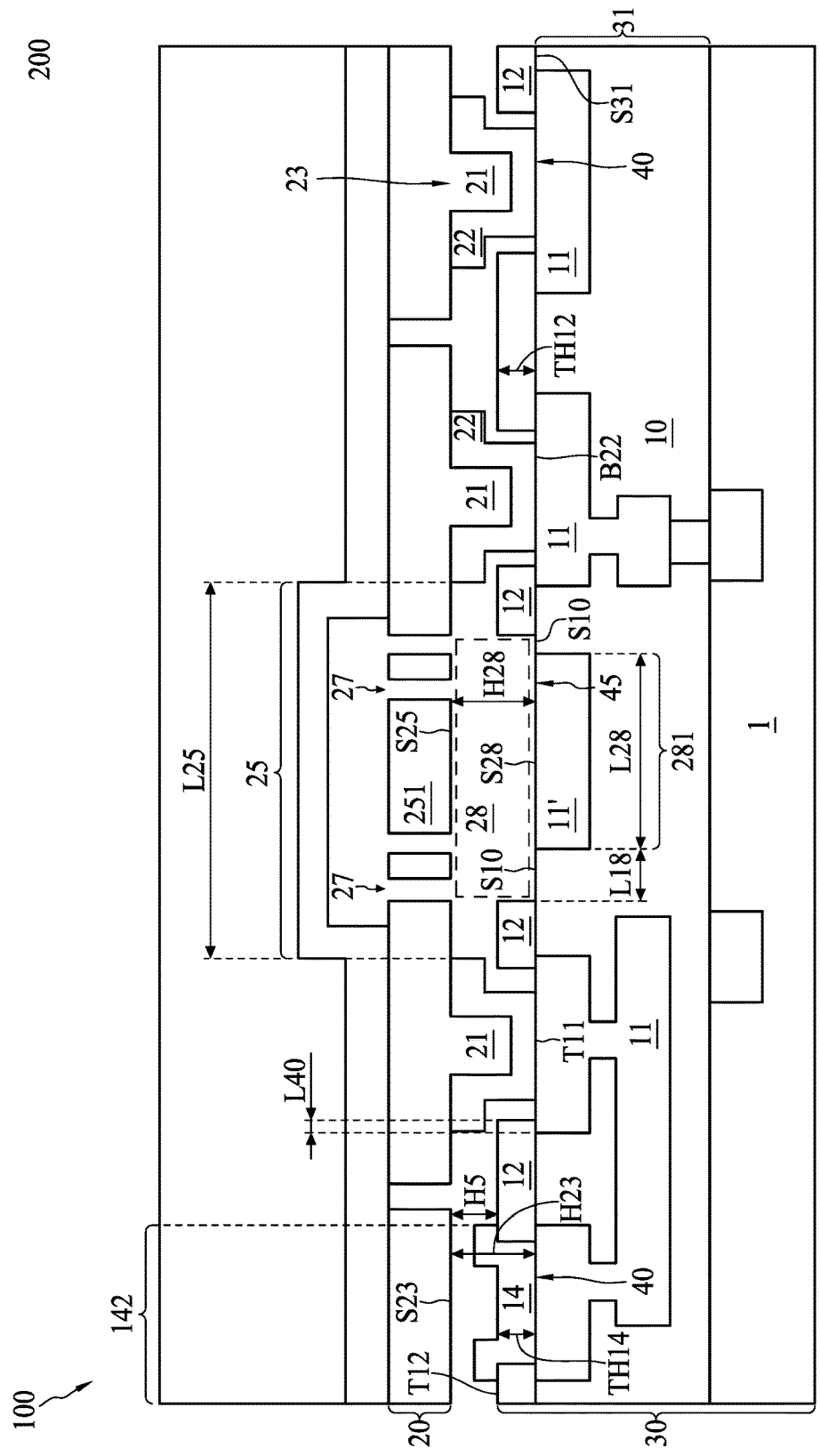
FIG. 2 is a cross-sectional view of a microelectromechanical system (MEMS), in accordance with some embodiments of the present disclosure.

FIG. 2 illustrates a MEMS 200. The MEMS 200 includes the semiconductive block 100 and the sensing electrode 30.

In some embodiments, the sensing electrode 30 includes a Complementary Metal-Oxide-Semiconductor (CMOS) structure. The sensing electrode 30 includes a semiconductive substrate 1, an interlayer dielectric (ILD) layer 31. The ILD layer 31 includes a conductive region and a dielectric region. The conductive region includes a conductive layer 11 and the dielectric region includes a dielectric layer 10. In some embodiments, the conductive layer 11 includes metal such as copper. The conductive layer 11 is exposed at a surface S31 of the ILD layer 31. In some embodiments, the surface S31 of the dielectric layer 10 of the ILD layer 31 is referred to as a dielectric surface at a top of the ILD layer 31. A top side T11 of the conductive layer 11 is substantially coplanar with the surface S31. Conductive layer 11' refers to the portion of the conductive layer 11 under the sensing structure 25. A top surface of the conductive layer 11' is termed a sensing surface S28. In some embodiments, sensing surface S28 of the conductive layer 11' is substantially coplanar with the surface S31. A first passivation layer 12 is on top of the ILD layer 31. An opening 40 is in the first passivation layer 12. The opening 40 is disposed at the portion of the first passivation layer 12 that is not under the sensing structure 25. The protruding structure 23 is disposed in the opening 40 on top of the conductive layer 11. In some other embodiments, conductive layer 14 of the sensing electrode 30, positioned under a portion 142 away from the sensing structure 25 can be made of aluminum copper (AlCu). The opening 40 includes a size suitable for the protruding structure 23 to be disposed in the opening 40 such that the bottom side B22 of the protruding structure 23 is in contact with a top side T11 of the conductive layer 11 at the top surface S31. A top side T12 of the first passivation layer 12 is exposed. The bottom side B22 is lower than the top side T12 of the first passivation layer 12. The top side T12 is above the surface S31. The protruding structure 23 is placed on top of the conductive layer 11. The bottom side B22 is substantially coplanar with the top side T11 of the conductive layer 11. The layer 22 is bonded with conductive layer 11. In some embodiments, the layer 22 includes tin (Sn). The conductive layer 11 includes copper. The layer 22 couples with the conductive layer 11 by a metallic bond such as a Cu—Sn bonding.

In some embodiments, the first passivation layer 12 includes a thickness TH12 from the top surface S31 to the top side T12 of the first passivation layer 12. The surface S23 is distanced from the surface S31 by the height H23. The surface S23 is above the top side T12 by a height H5. The height H23 is a sum of the height H5 and the thickness TH12.

A height H28 of the region 28 is from the surface S25 to the sensing surface S28. In some embodiments, the height H28 is substantially equal to the height H23. When the sensing piece 251 starts to move vertically, the height H28 changes to be greater or smaller than the height H23. A variation of the height H28 changes a capacitance between the sensing piece 251 and the conductive layer 11 under the surface S25. The capacitance is increased by reducing a sensing gap between the surface S31 and the surface S23.

The sensing gap is the height H23. By increasing the capacitance between the semiconductive block 100 and the sensing electrode 30, a sensitivity of the MEMS 200 is increased.

Reducing the height H23 increases a uniformity of the heights H23 of different protruding structures 23. A variation of the heights H23 among different protruding structures 23 can be decreased by reducing the height H23.

The height H23 of the protruding structure 23 is greater than the thickness TH12 to avoid the top side T12 of the first passivation layer 12 being in contact with the surface S23 of the semiconductive block 100. The protruding structure 23 can be reduced down to about the thickness TH12. In some embodiments, the thickness TH12 can be around 1 micrometer. The height H23 of the protruding structure 23 can be just greater than the thickness TH12. For example, the height H23 can be from around 1 micrometer to around 2 micrometers.

The sensing electrode 30 includes the sensing surface S28 at a top of the conductive region 11' under the sensing structure 25. The sensing surface S28 is substantially flat under the sensing structure 25. The sensing surface S28 is separated from the surface S25 by the height H23. The region 28 is over the sensing surface S28 and over the surface S10 of the exposed dielectric layer 10. Alternatively stated, surface portion of the ILD layer 31 that is under the sensing structure 25 further includes a sensing surface S28 and a dielectric surface S10. Surface S10 can be coplanar with the sensing surface S28. The region 28 is under the surface S25. In some embodiments, the region 28 is an air gap void of dielectric material such as the first passivation layer 12 or the layer 22. The first passivation layer 12 is away from the region 28 by a length L18. An opening 45 of the first passivation layer 12 is under the sensing structure 25. The opening 45 of the first passivation layer 12 exposes the sensing surface S28. In the opening 45, the first passivation layer 12 is distanced from the sensing surface S28 such that the dielectric layer 10 under the opening 45 is exposed. The opening 45 exposes a portion of the dielectric layer 10. The portion includes a surface S10 including the length L18. The surface S10 is flat and adjacent to the sensing surface S28. The exposed dielectric layer 10 includes the surface S10 substantially coplanar with the sensing surface S28. In some embodiments, the surface S31 is coplanar with the bottom side B22, sensing surface S28, surface S10, and the top side T11.

In some embodiments, the opening 45 of the first passivation layer 12 exposes the dielectric layer 10 under the sensing structure 25. Under the sensing structure 25, the first passivation layer 12 does not cover over the conductive layer 11'. Near the protruding structure 23, the first passivation layer 12 covers the dielectric layer 10 and a portion of the conductive layer 11 by a length L40. Near the protruding structure 23, the opening 40 does not expose the dielectric layer 10.

The region 28 is clear of the dielectric material to reduce a parasitic capacitance affecting the capacitance between the surface S25 and the sensing surface S28. The region 28 includes the height H28 and a length L28. Under static condition, the height H28 is substantially equal to the height H23. The sensing electrode 30 includes a structure 281 under the region 28. The structure 281 includes the conductive layer 11 and the dielectric layer 10 under the sensing surface S28. The sensing surface S28 is exposed to air. In some other embodiments, the conductive layer 11 near the surface S31 is covered by the conductive structure such as the aluminum copper layer. An interface such as the surface S31 between the structure 281 and the region 28 is substantially uniformly flat.

A conductive layer 14 is disposed on top of the conductive layer 11 near a peripheral away from the sensing surface S28. The conductive layer 14 includes a thickness TH14. In some embodiments, the conductive layer 14 is to be connected to a bonding wire (not shown). In some other embodiments, a portion 142 of the semiconductive block 100, including the semiconductive layer 20 and a cap layer, over the conductive layer 14 is removed.

In some embodiments, the semiconductive substrate 1 is a silicon substrate. The silicon substrate can include some semiconductor materials such as silicon carbon, silicon germanium, gallium arsenide, or the like. In some embodiments, a portion of semiconductive substrate 1 can include, for example, bulk silicon, doped or undoped, or an active layer of a semiconductor-on insulator (SOI) substrate. In some embodiments, semiconductive substrate 1 includes a layer of the semiconductor materials on an insulator layer. The insulator layer can be a buried oxide (BOX) layer or a silicon oxide layer. In some embodiments, the insulator layer is on a glass substrate. Other substrates, such as a multi-layered, epitaxial, or gradient substrate can also be used.

In some embodiments, some devices (not shown) can be at a surface of semiconductive substrate 1. The devices can be some electrical devices or some semiconductor devices such as various N-type metal oxide semiconductor (NMOS) and/or P-type metal-oxide semiconductor (PMOS) devices, CMOS, transistors, resistors, diodes, capacitors, inductor, photo-diodes, fuses, and the like. In some embodiments, the device is above the semiconductive substrate 1 near a bottom of the ILD layer 31.

The semiconductive substrate 1 includes some electrical circuitries (not shown). The electrical circuitry can include some interconnect structures (not shown). The Interconnect structures can further include some metal lines and some vias (not shown) formed therein and electrically coupled to the devices. The interconnect structures can be made of copper.

In some embodiments, the interconnect structures is in the ILD layer 31. Metal lines or metal layers such as conductive layers 11 are between the dielectric layers 10 to electrically connect some devices to each other. Some devices can also be in one or more dielectric layers.

The electrical circuitry on semiconductive substrate 1 can be any suitable type of circuitry for certain application. One of ordinary skill in the art will appreciate that the above examples are provided for illustrative purposes only and are not meant to limit the scope of the disclosure in any manner.

The conductive layer 11 or the conductive layer 14 can includes conductive materials such as aluminum, aluminum/silicon/copper alloy, titanium, titanium nitride, tungsten, polysilicon, metal silicide, or combinations thereof.

Figure 3:
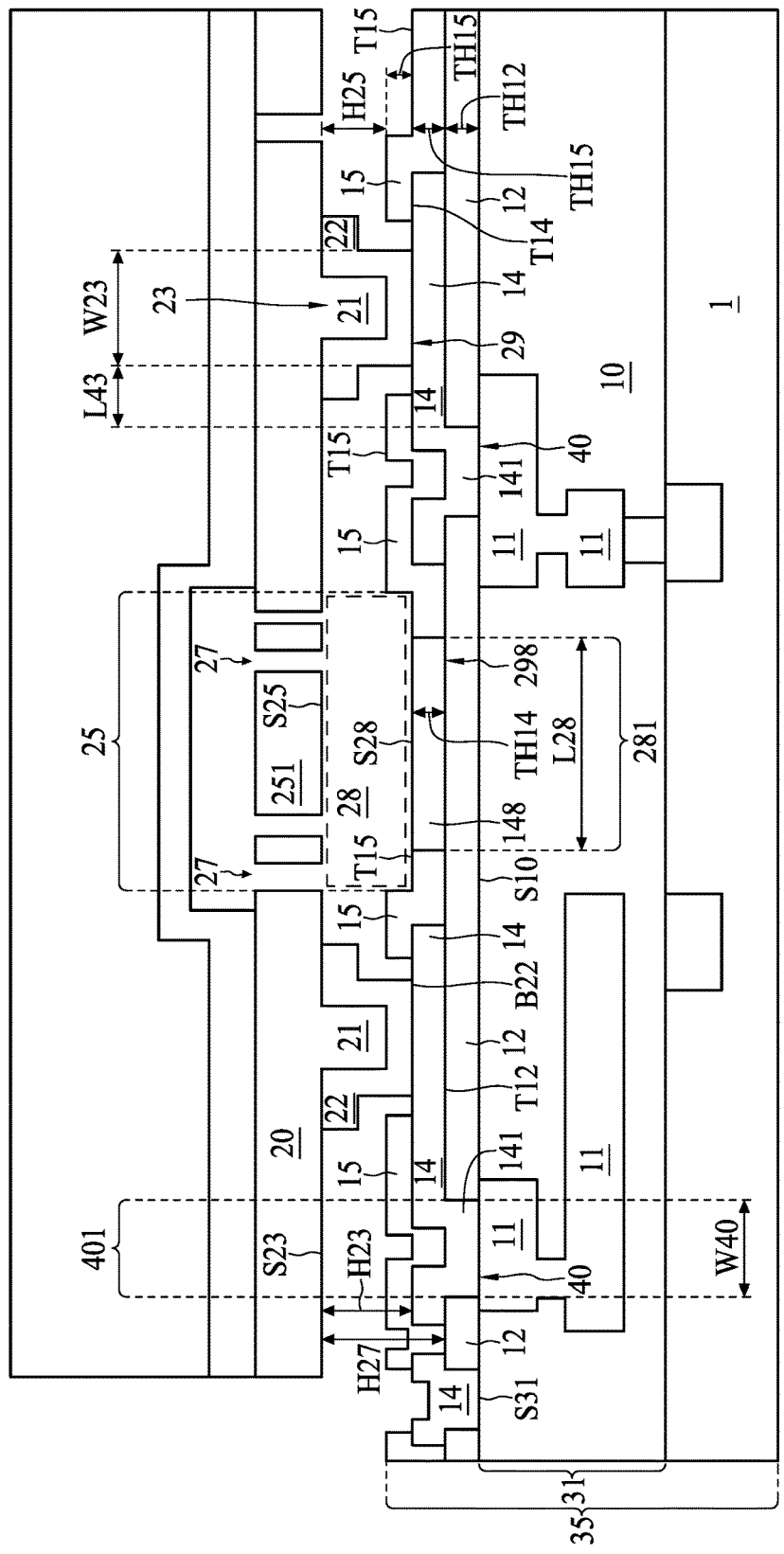
FIG. 3 is a cross-sectional view of a microelectromechanical system (MEMS), in accordance with some embodiments.

FIG. 3 illustrates a MEMS 300. The MEMS 300 includes the semiconductive block 100 and the sensing electrode 35. The MEMS 300 is similar to the MEMS 200 in FIG. 2, except that the MEMS 300 includes conductive layer 14 under the protruding structure 23 and over the first passivation layer 12. A second passivation layer 15 partially over a portion of the first passivation layer 12 near the protruding structure 23. It should be noted that the second passivation layer 15 is not under the sensing structure 25. In some embodiments, the first passivation layer 12 can be referred to as a lower passivation layer. The second passivation layer 15 can be referred to as an upper passivation layer. The upper passivation layer is above the lower passivation layer.

The sensing electrode 35 includes the semiconductive substrate 1, the interlayer dielectric (ILD) layer 31, the first passivation layer 12, the conductive layer 14, and the second passivation layer 15. The conductive layer 11 is bonded with the protruding structure 23 as in the sensing electrode 30 in FIG. 2. In FIG. 3, the conductive layer 11 away from the sensing surface S28 is partially covered by the conductive layer 14. In other words, the conductive layer 14 is partially in contact with the conductive layer 11. In some embodiments, the conductive layer 14 includes metal such as aluminum copper (AlCu). In some embodiments, the conductive layer 14 can be called conductive region similar to that shown in FIG. 2. In FIG. 3, the conductive region may refer to the conductive layer 14, whereas in FIG. 2, the conductive region may refer to the conductive layer 11.

The first passivation layer 12 including the opening 40 is on top of the ILD layer 31. In FIG. 2, the opening 40 exposes the conductive layer 11 in the sensing electrode 30 as shown in FIG. 2. In FIG. 3, the conductive layer 14 is inside the opening 40. A via 141 portion of the conductive layer 14 is positioned inside the opening 40. In some embodiments, via 141 can also be referred to as a recessed portion conformally disposed in the opening 40. The surface T14, or a third surface, connected with the bottom surface B22 of the protruding structure 23 is laterally distanced from the recessed portion. The term "laterally distanced" can mean to be disposed away by a distance in a lateral direction. The via 141 includes conductive material such as aluminum. The conductive layer 14 is lined to the opening 40 conformally such that a recess is in the conductive layer 14 over the opening 40. The opening 40 includes a width W40. The via 141 includes a width substantially equal to the width W40. In some embodiments, the width W40 is around 3 micrometers. A top region 401 over the opening 40 is void of the protruding structure 23. The conductive layer 14 includes a thickness TH14 from the top side T12 to a top side T14. The top side T12 of the first passivation layer 12 is distanced from the surface S23 by a height H27. In some embodiments, the opening 40 can be under the sensing structure 25.

The region 28 is under the surface S25 similar to the MEMS 200 in FIG. 2. The conductive layer 14 is disposed under the surface S25 or the region 28. The conductive layer 14 is between the surface S25 and the ILD layer 31. The conductive layer 14 under the surface S25 includes the length L28. The conductive layer 14 under the surface S25 is disposed on top of the first passivation layer 12. The sensing surface S28 is on the conductive layer 14 under the surface S25.

The protruding structure 23 is disposed on top of the conductive layer 14. In some embodiments, the protruding structure 23 is disposed laterally away from the opening 40 such that a region under the protruding structure 23 is void of the opening 40.

In some embodiments, a second passivation layer 15 is over the first passivation layer 12 or the conductive layer 14. The second passivation layer 15 over the opening 40 is non-uniform and may include recesses. The protruding structure 23 is disposed away from the opening 40 to avoid disposing the protruding structure 23 on a non-uniform surface. By disposing the protruding structure 23 on a substantially flat surface, the height H23 can be substantially constant and uniform throughout the MEMS 300 between the semiconductive block 100 and the sensing electrode 35. Instead of disposing the protruding structure 23 over the opening 40, the protruding structure 23 is disposed away from the opening 40 by a length L43. In some embodiments, the length L43 is from a side of the protruding structure 23 to a side of the opening 40. The bottom side B22 of the protruding structure 23 includes a width W23. The top side T14 in contact with the bottom side B22 is substantially flat and includes a width W23.

The protruding structure 23 is over the first passivation layer 12. Instead of disposing the protruding structure 23 in the opening 40 of the first passivation layer 12, as shown in FIG. 2, the protruding structure 23 is disposed above the first passivation layer 12. The protruding structure 23 can be reduced down to about a thickness TH15 of the second passivation layer 15. In some embodiments, the thickness TH15 can be around 1 micrometer.

The layer 22 is bonded with the conductive layer 14. In some embodiments, the conductive layer 14 includes AlCu. In some embodiments, the layer 22 includes Ge and couples with the conductive layer 14 by a bond such as AlCu—Ge bonding. The bottom side B22 of the protruding structure 23 is above the top surface S31 or the top side T12. The bottom side B22 is substantially coplanar with the top side T14 or the sensing surface S28.

The surface S23 is distanced from the top side T14 by the height H23. The surface S23 is above the top side T12 by the height H27. In some embodiments, the height H27 is greater than the height H5 in FIG. 2 by the thickness TH14. The height H27 is a sum of the height H23 and the thickness TH14.

The sensing electrode 35 includes a sensing surface S28 at a top of the conductive layer 14 and under the sensing structure 25. In some embodiments, the region 28 is the air gap over the sensing surface S28 void of the first passivation layer 12, the second passivation layer 15, the conductive layer 14, or the layer 22. In some embodiments, the sensing surface S28 is substantially flat and coplanar with the top side T15 under the sensing structure 25. A portion of the top side T15 under the sensing structure 25 is substantially flat and bordered with the sensing surface S28. The sensing surface S28 is below the first passivation layer 12, although not directly under the first passivation layer 12, as shown in FIG. 2. The sensing surface S28 is above the first passivation layer 12, as shown in FIG. 3 of the present embodiment. Sensing surface S28 is coplanar with the top surface S31 as shown in FIG. 2. The sensing surface S28 in the sensing electrode 35 is above the top surface S31 of the ILD layer 31 in FIG. 3 of the present embodiment. The sensing surface S28 is above the top surface S31 by approximately a sum of the thickness TH14 and the thickness TH12. A portion 148 of the conductive layer 14 is positioned under the sensing surface S28. The portion 148 is separated from the surface S31 of the ILD layer 31 by the first passivation layer 12.

The first passivation layer 12 is covering on top of the ILD layer 31. In FIG. 2, the surface S10 of the ILD layer 31 in the region 281 is exposed. In FIG. 3, the first passivation layer 12 is disposed on top of the ILD layer 31 without exposing surface S31 of the ILD layer 31 as far as the region 281 is concerned. The first passivation layer 12 is under the conductive layer 14, the second passivation layer 15, and the protruding structure 23.

The sensing electrode 35 includes a region 281 correspondingly under the region 28. In the region 281, the first passivation layer 12 is disposed on top of the ILD layer 31. The first passivation layer 12 is under portion 148 of the conductive layer 14.

In FIG. 3, a second passivation layer 15 is over the first passivation layer 12. In some embodiments, the sensing electrode 35 includes the second passivation layer 15. The second passivation layer 15 is conformally covering portions of the conductive layer 14. The second passivation layer 15 is lined to the recess of the conductive layer 14 such that a recess of the second passivation layer 15 is disposed over the recess of the conductive layer 14. In some embodiments, the second passivation layer 15 is on top of the first passivation layer 12. The second passivation layer 15 is covering conformally on top of the first passivation layer 12 and the conductive layer 14 such that a top side T15 of the second passivation layer 15 includes different height from the surface S23. A height H25 is from the top side T15 of the upper portion of the second passivation layer 15 to the surface S23. The height H25 is smaller than the height H23.

The second passivation layer 15 includes a thickness TH15 from the top side T12 of the first passivation layer 12 to the top side T15 of the second passivation layer 15. In some embodiments, the thickness TH15 of the second passivation layer 15 is substantially equal to the thickness TH14 of the conductive layer 14. In some embodiments, a portion of the top side T15 of the second passivation layer 15 is substantially coplanar with the top side T14 of the conductive layer 14. The height H23 of the protruding structure 23 is greater than the thickness TH15 to avoid the top side T15 of the second passivation layer 15 being in contact with the surface S23 of the semiconductive block 100.

In some embodiments, the sensing surface S28 is coplanar with a top of the second passivation layer 15 in proximity with the sensing surface S28. The second passivation layer 15 includes a passivation opening 298 to expose the sensing surface S28. In some embodiments, the second passivation layer 15 is laterally in contact with the conductive layer 14 in the region 281. The second passivation layer 15 includes the passivation opening 298 in the region 281. The opening 298 includes the length L28 from one side of the second passivation layer 15 to an opposite side of the second passivation layer 15. The region 28 above the sensing surface S28 is void of the second passivation layer 15. The sensing surface S28 is a top surface of the conductive layer 14. In some embodiments, the sensing surface S28 is coplanar with the bottom side B22, similar to the sensing electrode 30 in FIG. 2. The second passivation layer 15 includes an opening 29 to receive the protruding structure 23. The opening 29 includes a width wider than the width W23.

The conductive layer 14 is disposed on top of the conductive layer 11 away from the surface S25. In some embodiments, a portion of the conductive layer 14 near the peripheral is for coupling to a bonding wire (not shown). As shown in FIG. 3, a portion of the semiconductive block 100 at a peripheral of the MEMS 300 is removed. Said portion is removed such that the bonding wire can be connected to the conductive layer 14.

In some embodiments, the dielectric layer 10, the first passivation layer 12, or the second passivation layer 15 includes dielectric material including silicon dioxide, silicon nitride, silicon oxynitride, polyimide, spin-on glass (SOG), fluoride-doped silicate glass (FSG), carbon doped silicon oxide, Xerogel, Aerogel, amorphous fluorinated carbon, Parylene, BCB (bis-benzocyclobutenes), polyimide, and/or other suitable materials. The ILD material includes silicon oxide. Alternatively or additionally, the ILD layer 31 includes a material having a low dielectric constant.

Figure 4:
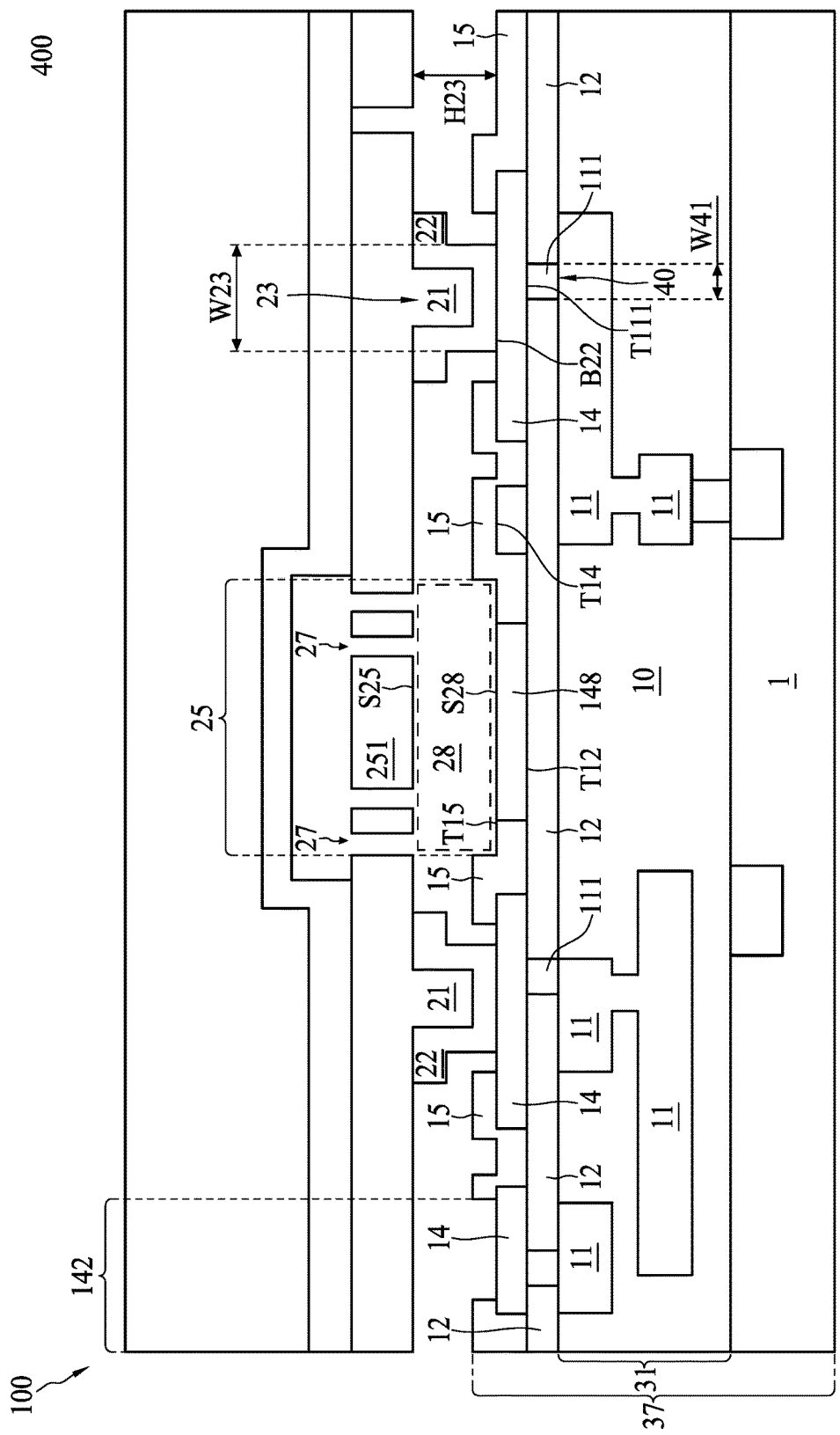
FIG. 4 is a cross-sectional view of a MEMS, in accordance with some embodiments.

FIG. 4 illustrates a MEMS 400 similar to the MEMS 300 in FIG. 3, except that a conductive via 111 is inside the opening 40 of the first passivation layer 12. The protruding structure 23 is disposed over the opening 40 of FIG. 4 instead of away from the opening 40, as shown in FIG. 3. The MEMS 400 includes the sensing electrode 37 and the semiconductive block 100.

Referring to FIG. 3 and FIG. 4, in FIG. 3, the opening 40 accommodates conductive material substantially identical to the conductive layer 14 outside of the via 141. In FIG. 4, however, the opening 40 accommodates material such as copper or tungsten (W) in the conductive via 111. The material filling in the conductive via 111 is substantially different from the conductive layer 14 outside of the opening 40. Conductive via 111 is made of material different from that of the conductive layer 14. The conductive via 111 couples between the conductive layer 11 and the conductive layer 14.

In some embodiments, the opening 40 includes the width W41 substantially smaller than the width W40 in the sensing electrode 35 in FIG. 3. The width 41 can be around 0.5 micrometers. A top side T111 of the conductive via 111 is substantially coplanar with the top side T12 of the first passivation layer 12. The top side T111 of the conductive via 111 is in contact with the conductive layer 14. A bottom side of the conductive via 111 is in contact with a conductive path such as the conductive layer 11. In some embodiments, the width W23 of the protruding structure 23 is greater than the width W41. The conductive via 111 includes a width substantially equal to the width W41.

The conductive layer 14 covers on top of the first passivation layer 12 and the conductive via 111. As shown in FIG. 2 and FIG. 3, conductive layer 14 not under region 28 includes a recess portion in the opening 40 of the first passivation layer 12. In FIG. 4, the conductive layer 14 not under region 28 does not possess a recess portion as those in FIG. 2 and FIG. 3, but being substantially flat over the opening 40 of the first passivation layer 12. Since the top side T111 is substantially coplanar with the top side T12, the conductive layer 14 is substantially flat on top of the conductive via 111 and the first passivation layer 12. The top side T14 of the conductive layer 14 is also substantially flat over the opening 40. Since the top side T14 over the opening 40 is substantially flat, the protruding structure 23 can be disposed on top of the top side T14 of the conductive layer 14 over the opening 40 and maintain a substantially constant height H23.

Referring to FIG. 3 and FIG. 4. In FIG. 3, the protruding structure 23 is disposed away laterally from the opening 40 by the length L43. In FIG. 4, the protruding structure 23 can be disposed directly over the opening 40. In some embodiments, the protruding structure 23 is directly over the opening 40 such that the bottom side B22 is over the top side T111. Since the protruding structure 23 can be disposed closer to the opening 40 than away from the opening 40 as in FIG. 3, a size of the sensing electrode 37 can be made smaller than a size of the sensing electrode 35 in FIG. 3. In addition, because the conductive via 111 can be made smaller than the via 141 (or recess), a total footprint of the device decreases. Deposition of W or Cu in a fine via is feasible while depositing AlCu is not.

In some embodiments, the semiconductive block 100 is void of a portion 142. The portion 142 of the semiconductive block 100 is over a bonding portion of the conductive layer 14. The bonding portion can be connected to a bonding wire (not shown).

Figure 5:
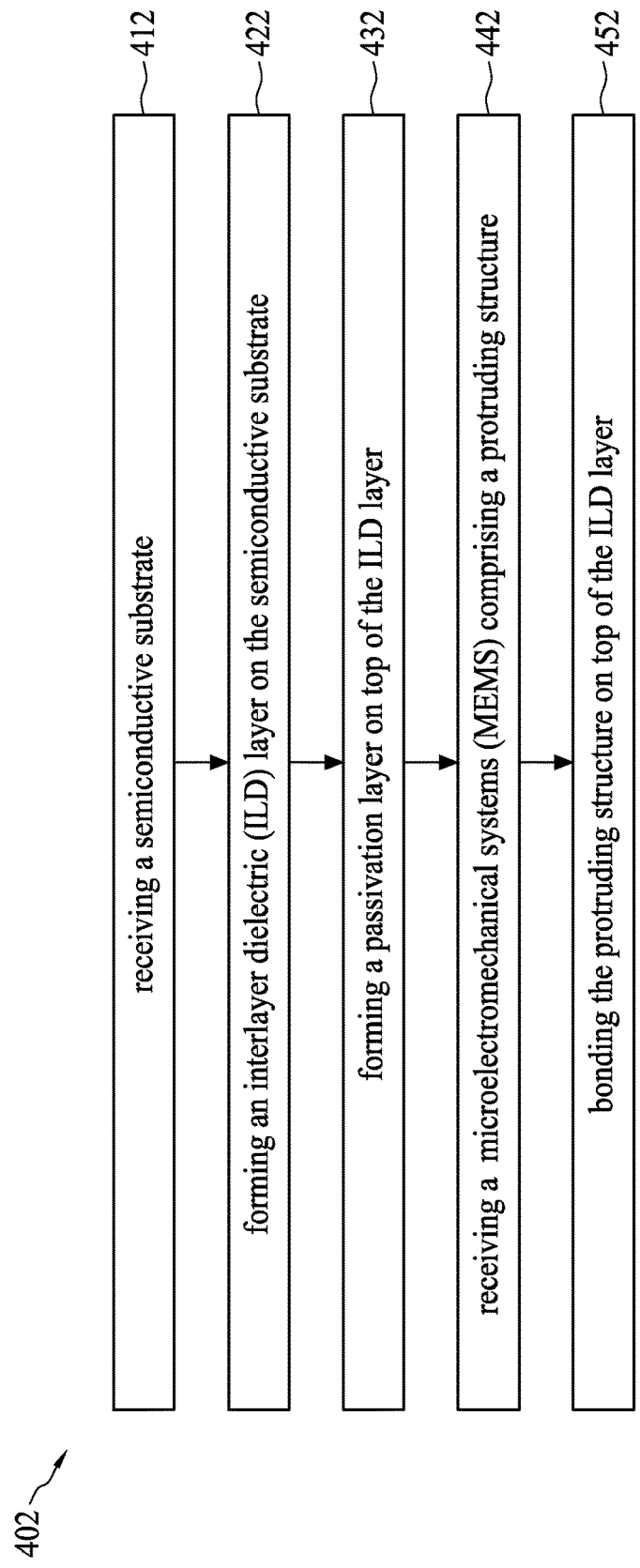
FIG. 5 is an operational flow of a method for manufacturing a MEMS, in accordance with some embodiments.
Figure 6:
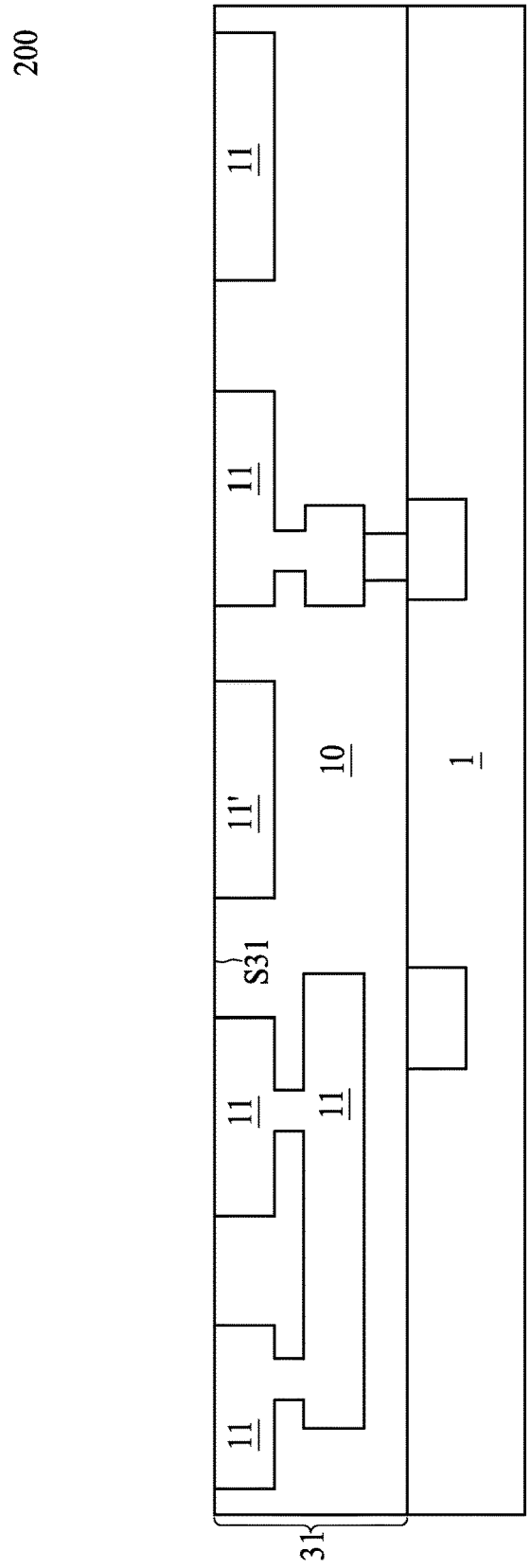
FIGS. 6 to 9 are cross sectional views of an operation in a method for manufacturing a MEMS, in accordance with some embodiments.
Figure 7:
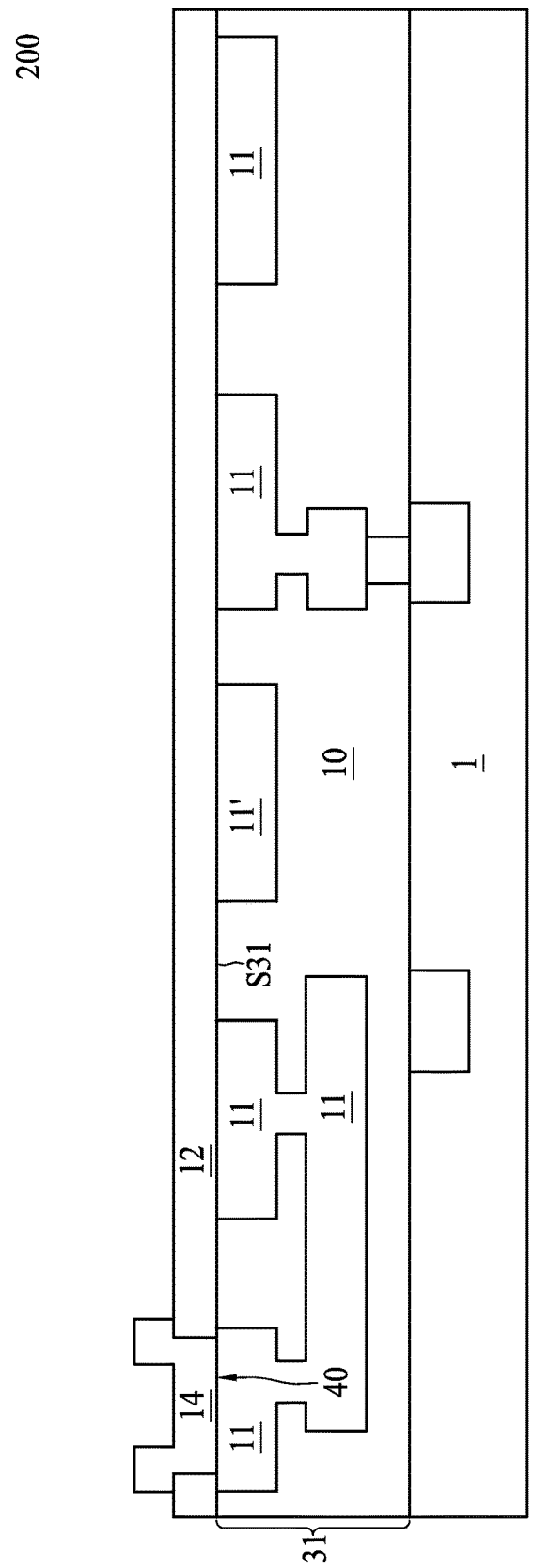
Figure 8:
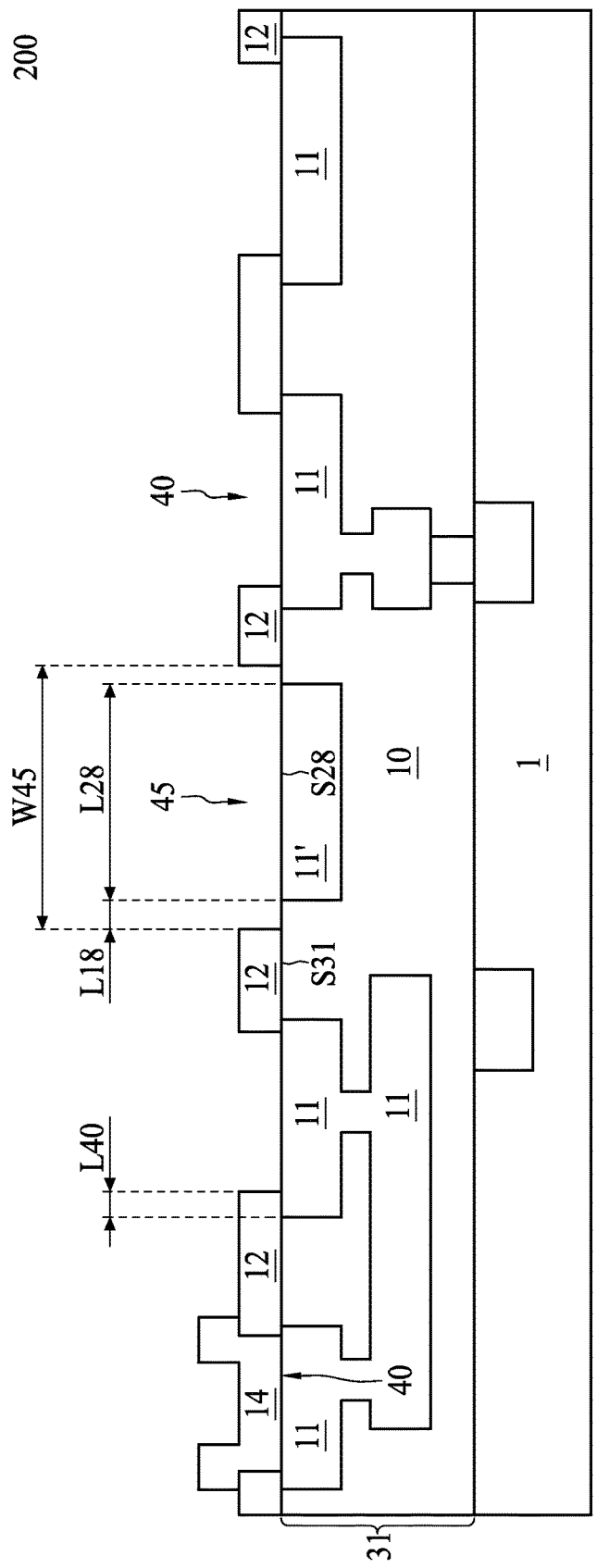
Figure 9:
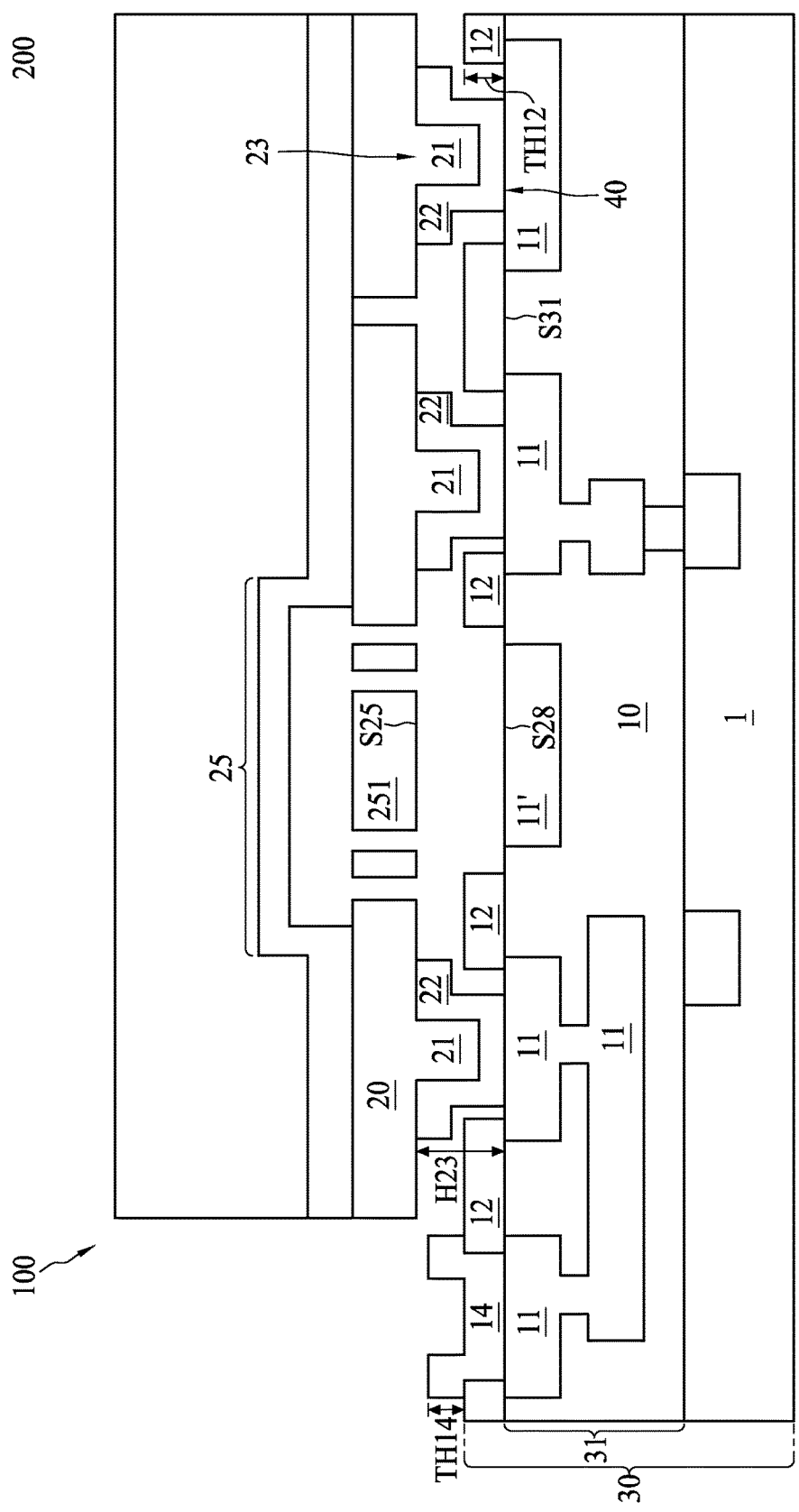

In FIG. 5, a method of manufacturing 402 is illustrated. FIG. 5 illustrates an operation flow for forming the image sensor 200 in FIG. 2. Operation 412 receives a semiconductive substrate 1. Some exemplary embodiments for operation 412 are illustrated in FIG. 6. Operation 422 forms an interlayer dielectric (ILD) layer 31 on the semiconductive substrate 1. Some exemplary embodiments for operation 422 are illustrated in FIG. 6. Operation 432 forms a first passivation layer 12 on top of the ILD layer 31. Some exemplary embodiments for operation 432 are illustrated in FIGS. 7 to 8. Operation 442 receives a semiconductive block 100 comprising a protruding structure 23. Some exemplary embodiments for operation 442 are illustrated in FIG. 9. Operation 452 bonds the protruding structure 23 on top of the ILD layer 31. Some exemplary embodiments for operation 452 are illustrated in FIG. 9.

In FIG. 6, a dielectric layer 10 is formed on the semiconductive substrate 1. The dielectric layer 10 is patterned to include openings to be filled by conductive material such as copper to form via structure or the conductive layer 11 inside the openings. The patterning is formed by any suitable operation such as lithographic.

The conductive layer 11 is formed on top of the dielectric layer 10 and over the semiconductive substrate 1. The conductive layer 11 is patterned to include openings to be filled by dielectric materials to form dielectric layer 10. Operations of forming and pattering the conductive layer 11 and the dielectric layer 10 are performed from layers to layers forming a stack of alternating conductive layer 11 and dielectric layer 10 in the ILD layer 31. The conductive layer 11 can be made of copper. The via structure are formed connecting the conductive layer 11 above and below the via structure in the ILD layer 31. Conductive layer 11' is formed at a top of the ILD layer 31. The surface S31 of the ILD layer 31 is formed substantially flat by a suitable planarization operation such as chemical mechanical polish (CMP) or etching back. The planarization operation planarizes a top of the conductive layer 11' coplanar with surface S31.

FIG. 7 illustrates forming a dielectric layer such as the first passivation layer 12 on top of the ILD layer 31 by any suitable operation such as a deposition operation. Patterning the first passivation layer 12 to form the opening 40 is followed by depositing and patterning the conductive layer 14 in the opening 40. The conductive layer 14 is formed at a peripheral of the MEMS 200. In some embodiments, the first passivation layer 12 is blanket deposited over the surface S31 of the ILD layer 31.

The deposition operation may include chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure chemical vapor deposition (LPCVD) operation, thermal oxidation, UV-ozone oxidation, epitaxial growth methods (e.g., selective epitaxy growth), sputtering, plating, spin-on coating, other suitable methods, and/or combinations thereof.

The opening 40 of the first passivation layer 12 is formed at the peripheral by patterning the first passivation layer 12. The conductive layer 14 is formed conformally covering over the first passivation layer 12 and the conductive layer 11 near the opening 40 such that the recess is formed in the first passivation layer 12 over the opening 40. The conductive layer 14 is then patterned to form a remaining portion near the opening 40. Other portions of the conductive layer 14 are removed by any suitable operation such as etching.

In FIG. 8, the first passivation layer 12 is patterned to form additional opening 40 such that the conductive layer 11' and 11 underneath the first passivation layer 12 is exposed. The opening 45 exposes the conductive layer 11', whereas the opening 40 exposes the conductive layer 11. A patterning operation includes covering the first passivation layer 12 and the conductive layer 14 by a photoresist (not shown). The photoresist is patterned by any lithographic operation. The first passivation layer 12 is etched following a pattern of the photoresist to form the openings 40 and 45. In some embodiments, the first passivation layer 12 is patterned such that a portion of the first passivation layer 12 is over a portion of the conductive layer 11. The portion of the first passivation layer 12 is overlapping the portion of the conductive layer 11 by the length L40.

The opening 45 is formed to expose a portion of the dielectric layer 10 by a length L18. The sensing surface S28 is at the top of the conductive layer 11'. The opening 45 includes a width W45. The width W45 is greater than the length L28 of the sensing surface S28.

In FIG. 9, the protruding structure 23 of the semiconductive block 100 is bonded to the surface S31 of the ILD layer 31. The protruding structure 23 is fitted into the opening 40. The surface S25 at a bottom of the sensing piece 251 in the sensing structure 25 is aligned to be over the sensing surface S28. In some embodiments, the portion 142 of the semiconductive block 100 in FIG. 2 is removed after bonding the semiconductive block 100 with the sensing electrode 30. In some embodiments, the layer 22 of the protruding structure 23 is made of Tin. The conductive layer 11 is made of Cu. The layer 22 forms Sn—Cu bonding with the conductive layer 11 under a heating operation using a predetermined temperature.

The protruding semiconductor 21 is formed by patterning using suitable operation such as etching. The height H23 can be designed to be as small as a predetermined height just greater than the thickness TH12 of the first passivation layer 12 plus the thickness TH14 of the conductive layer 14. Reducing the height H23 of the protruding structure 23 in a formation of the semiconductive block 100 increases a uniformity of the heights H23. Increasing the uniformity control of the heights H23 can help increase the uniformity of a distance between the sensing surface S28 and the surface S25.

Figure 10:
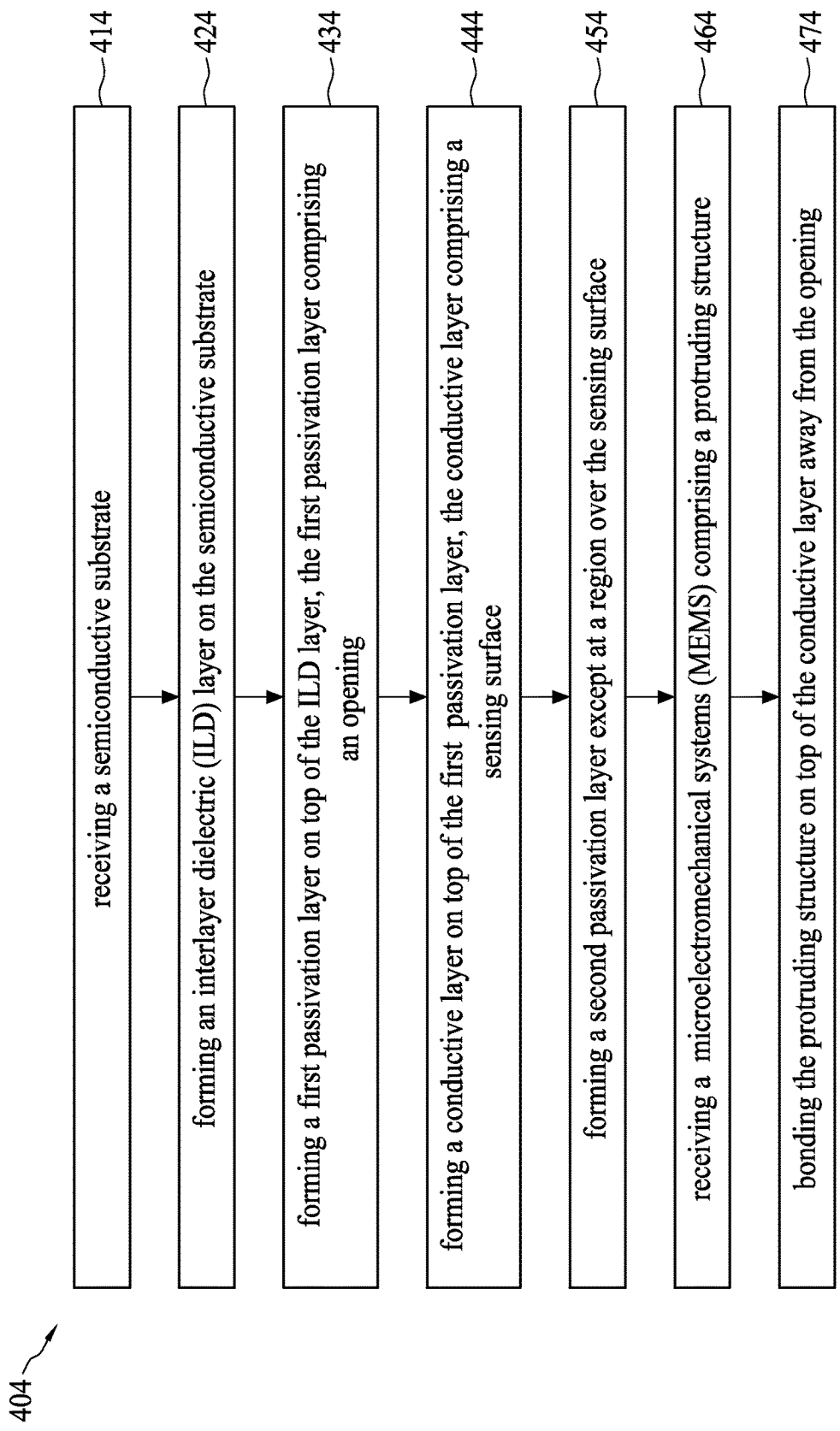
FIG. 10 is an operational flow of a method for manufacturing a MEMS, in accordance with some embodiments.
Figure 11:
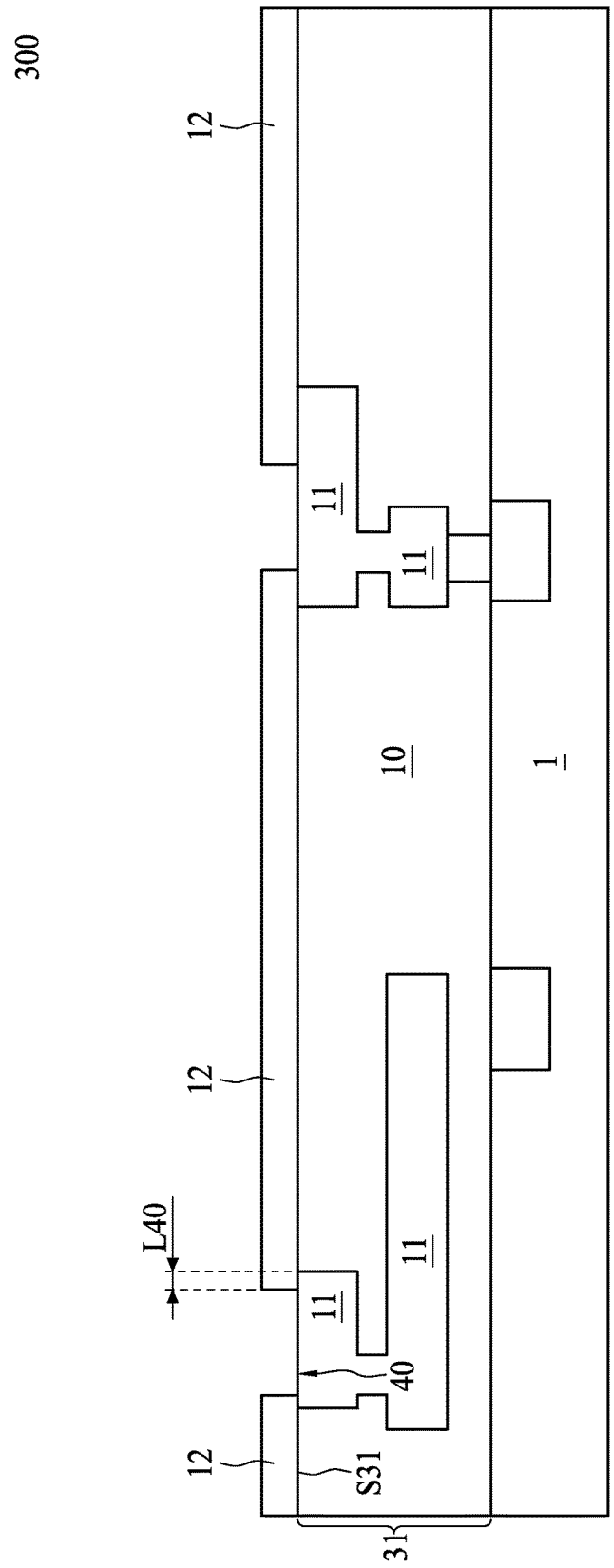
FIGS. 11 to 15 are cross sectional views of an operation in a method for manufacturing a MEMS, in accordance with some embodiments.
Figure 12:
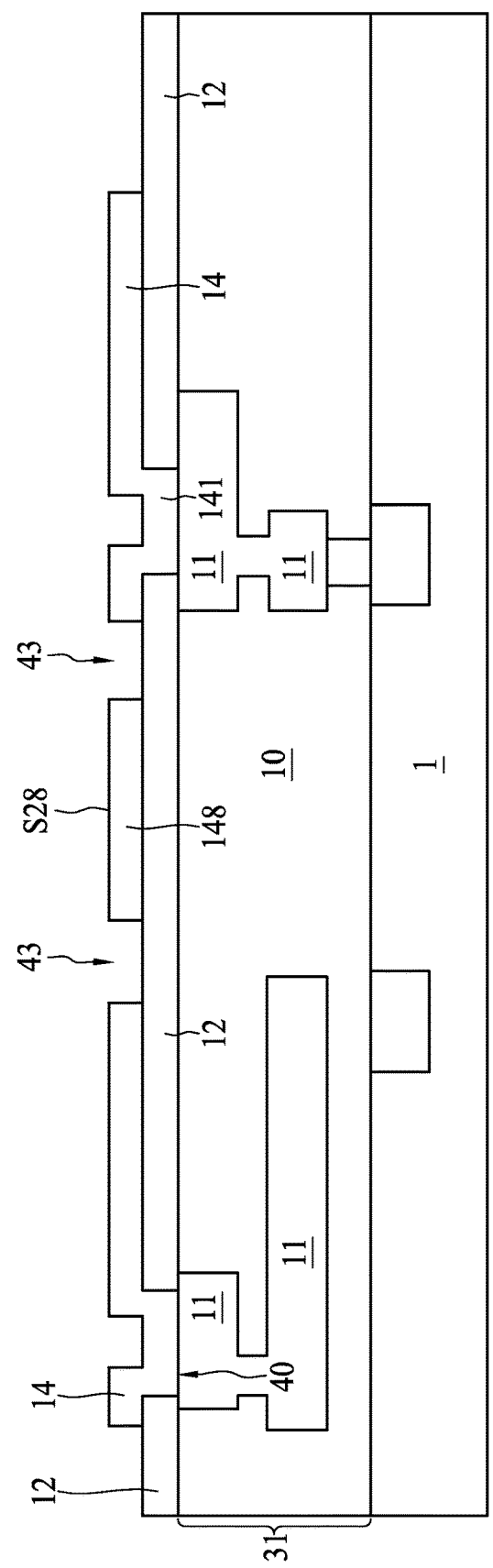
Figure 14:
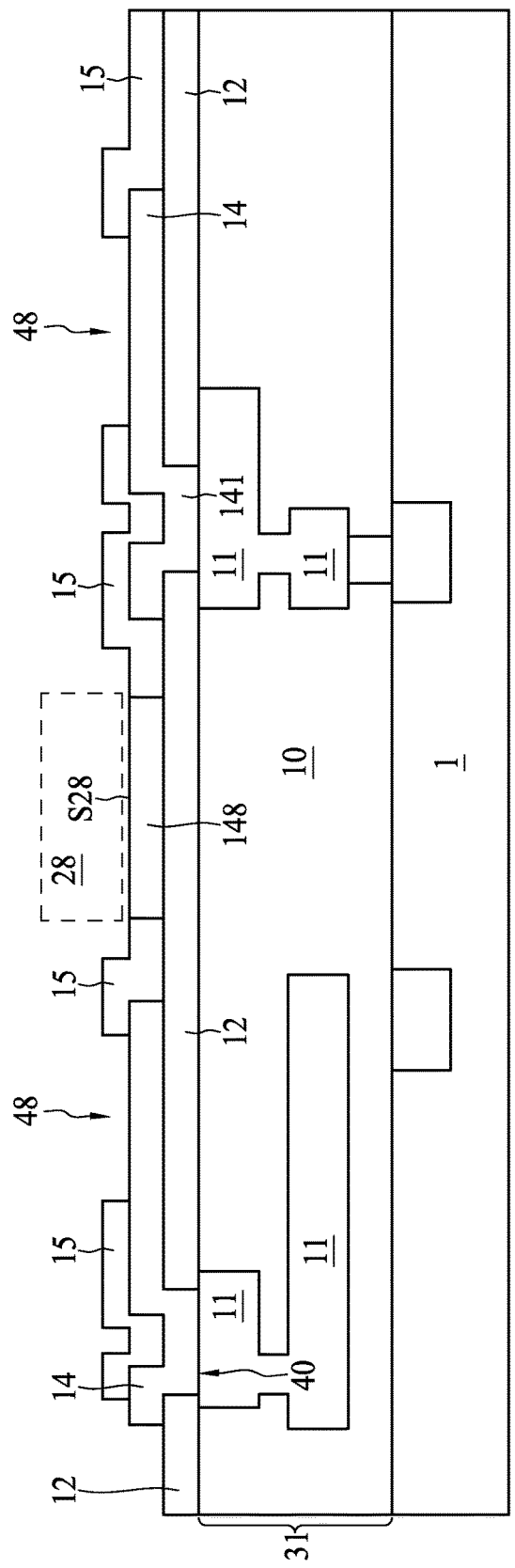
Figure 15:
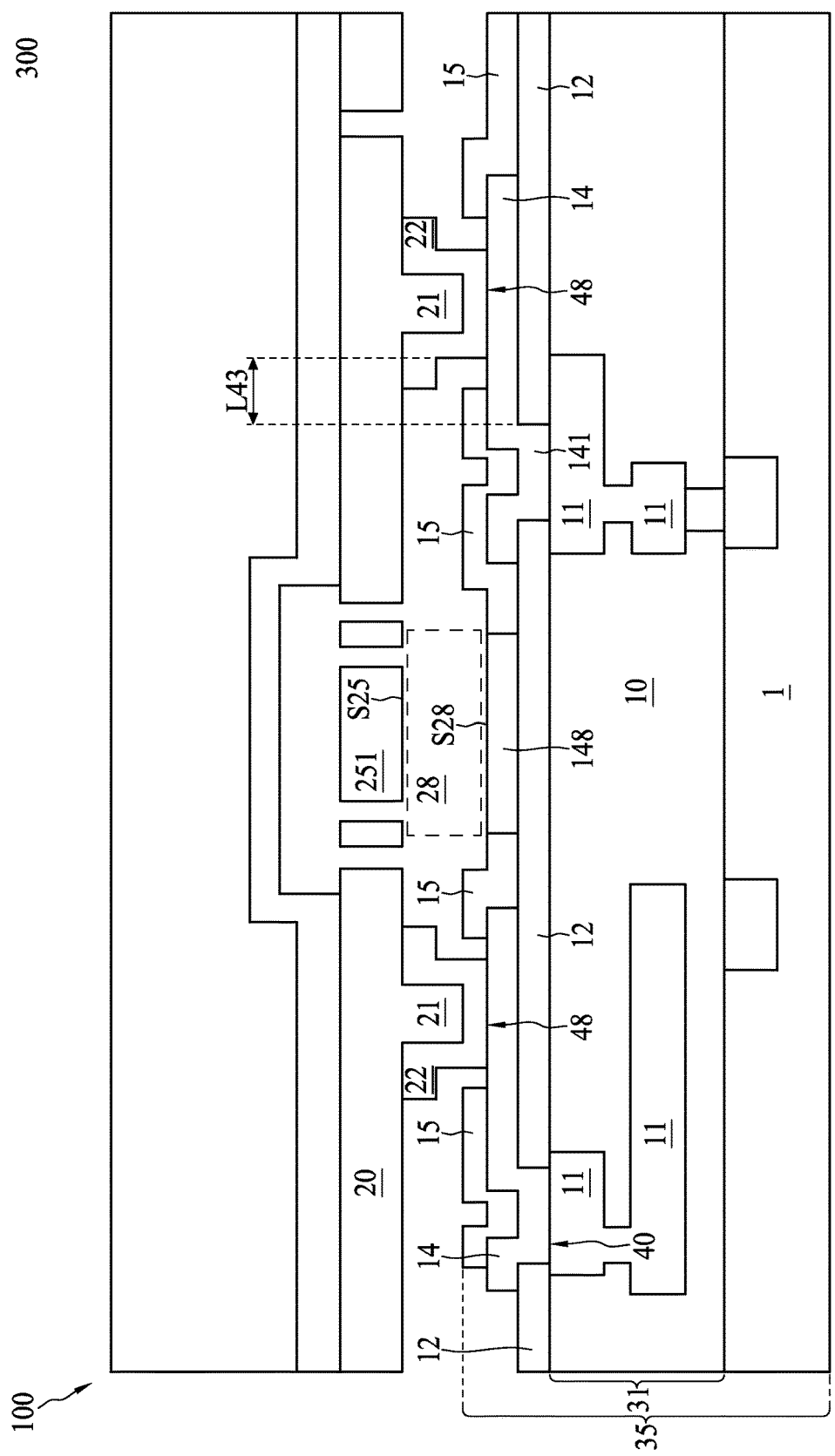

In FIG. 10, a method of manufacturing 404 a MEMS is illustrated. FIG. 10 illustrates an operation flow for forming the image sensor 300 in FIG. 3. Operation 414 receives a semiconductive substrate 1. Some exemplary embodiments for operation 414 are illustrated in FIG. 11. Operation 424 forms an interlayer dielectric (ILD) layer 31 on the semiconductive substrate 1. Some exemplary embodiments for operation 424 are illustrated in FIG. 11. Operation 434 forms a first passivation layer 12 on top of the ILD layer 31, the first passivation layer 12 comprising an opening 40. Some exemplary embodiments for operation 434 are illustrated in FIG. 11. Operation 444 forms a conductive layer 14 on top of the first passivation layer 12, the conductive layer 14 comprising a sensing surface S28. Some exemplary embodiments for operation 444 are illustrated in FIG. 12. Operation 454 forms a second passivation layer 15 over the conductive layer 14 except at a region 28 over the sensing surface S28. Some exemplary embodiments for operation 454 are illustrated in FIG. 14. Operation 464 receives a semiconductive block 100 comprising a protruding structure 23. Some exemplary embodiments for operation 464 are illustrated in FIG. 15. Operation 474 bonds the protruding structure 23 on top of the conductive layer 14 away from the opening 40. Some exemplary embodiments for operation 474 are illustrated in FIG. 15.

FIG. 11 illustrates forming the first passivation layer 12 on top of the ILD layer 31. The first passivation layer 12 is patterned to include the opening 40 exposing the conductive layer 11. The sensing surface S28 is exposed by the opening 45 of the first passivation layer 12 as illustrated in FIG. 8. In FIG. 11, the sensing surface S28 is above the first passivation layer 12 and is illustrated in FIG. 12. The first passivation layer 12 is patterned to include the portion overlapping with the conductive layer 11 by the length L40.

In FIG. 12, the conductive layer 14 is formed conformally covering over the first passivation layer 12, the opening 40, and the conductive layer 11. The conductive layer 14 partially fills the opening 40 to be in contact with the conductive layer 11. The conductive layer 14 is conformally formed in the opening 40 such that the recess of the conductive layer 14 is formed. The sensing surface S28 is above the first passivation layer 12. The conductive layer 14 is patterned to include an opening 43 near the sensing surface S28. In some embodiments, opening 43 is formed surrounding the sensing surface S28 such that a portion 148 of the conductive layer 14 including the sensing surface S28 is to be aligned under sensing structure 25.

Figure 13:
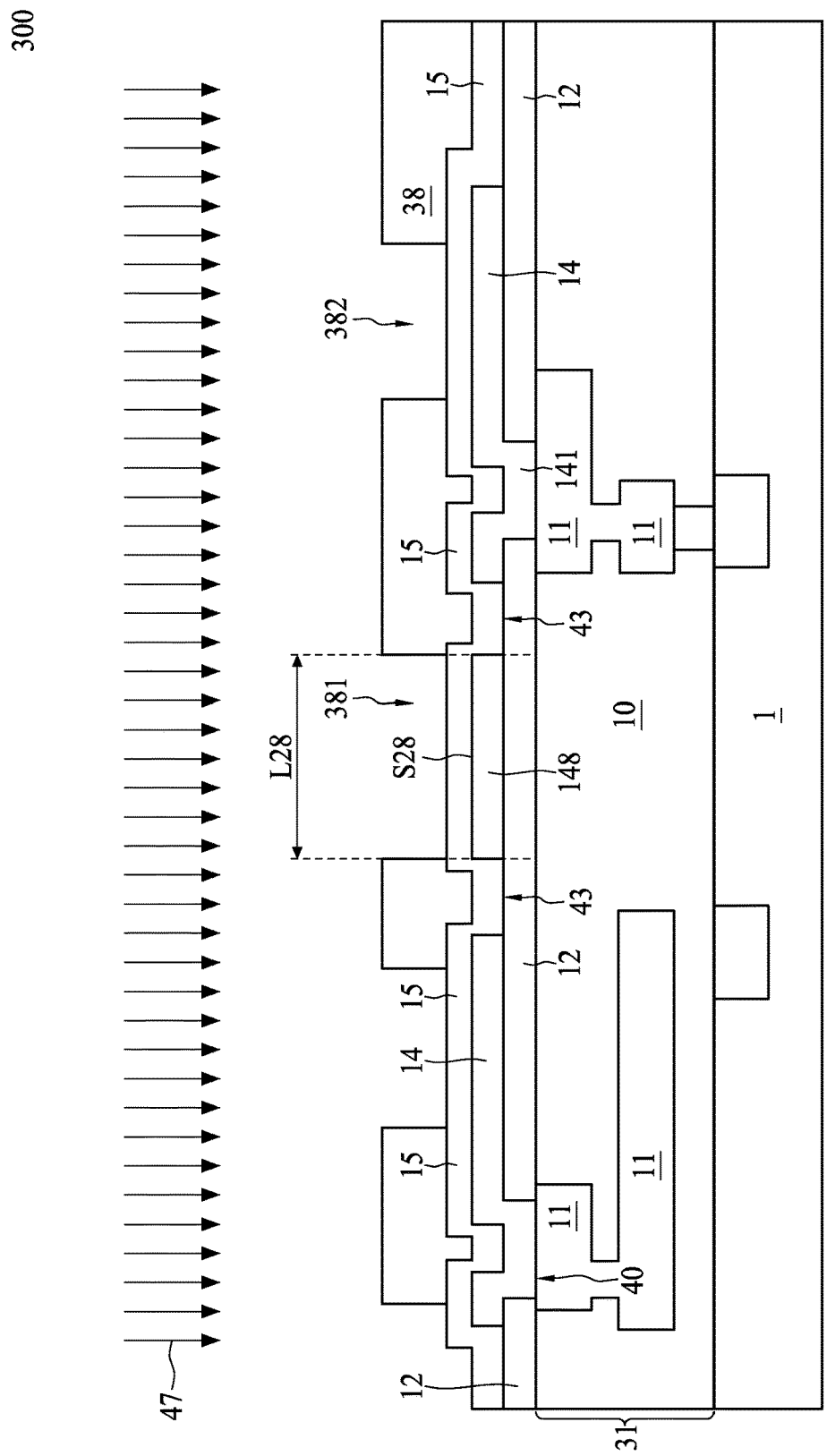

FIG. 13 illustrates the second passivation layer 15 is formed blanket covering over the first passivation layer 12 and the conductive layer 14. The second passivation layer 15 is formed conformally over the opening 43 and over the recess portion of the conductive layer 14 such that the recesses of the second passivation layer 15 is formed over the opening 43 and over the recess portion of the conductive layer 14.

A resist 38 is patterned on top of the second passivation layer 15. The resist 38 can be a photoresist to pattern the second passivation layer 15 following a pattern of the resist 38. The resist 38 includes an opening 381 aligned with the sensing surface S28 such that the second passivation layer 15 over the sensing surface S28 can be removed by any suitable etching operation 47 to expose the sensing surface S28 on the portion 148 of the conductive layer 14. In some embodiments, the opening 381 includes a width substantially equal to the length L28 in FIG. 2 or 3.

The resist 38 includes an opening 382 away from the sensing surface S28 for removing the second passivation layer 15 to expose the conductive layer 14. The etching operation 47 removes exposed portions of the second passivation layer 15, while portions covered by the resist 38 are protected and remained after the etching operation 47.

In FIG. 14, a dielectric layer such as the second passivation layer 15 is patterned to expose the portion 148 of the conductive layer 14 and the sensing surface S28. The sensing surface S28 is exposed such that the region 28 above the sensing surface S28 is void of the second passivation layer 15. An opening 48 is formed in the second passivation layer 15 outside of the sensing surface S28 to expose the conductive layer 14 to be bonded with the protruding structure 23 as illustrated in FIG. 15.

In FIG. 15, the protruding structure 23 of the semiconductive block 100 inserted in the opening 48 and bonded to exposed portions of the conductive layer 14. The protruding structure 23 is fitted into the opening 48. The surface S25 of the sensing piece 251 is aligned over the sensing surface S28. The protruding structure 23 is bonded on top of the conductive layer 14 away from the opening 40 by a lateral distance such as the length L43.

Figure 16:
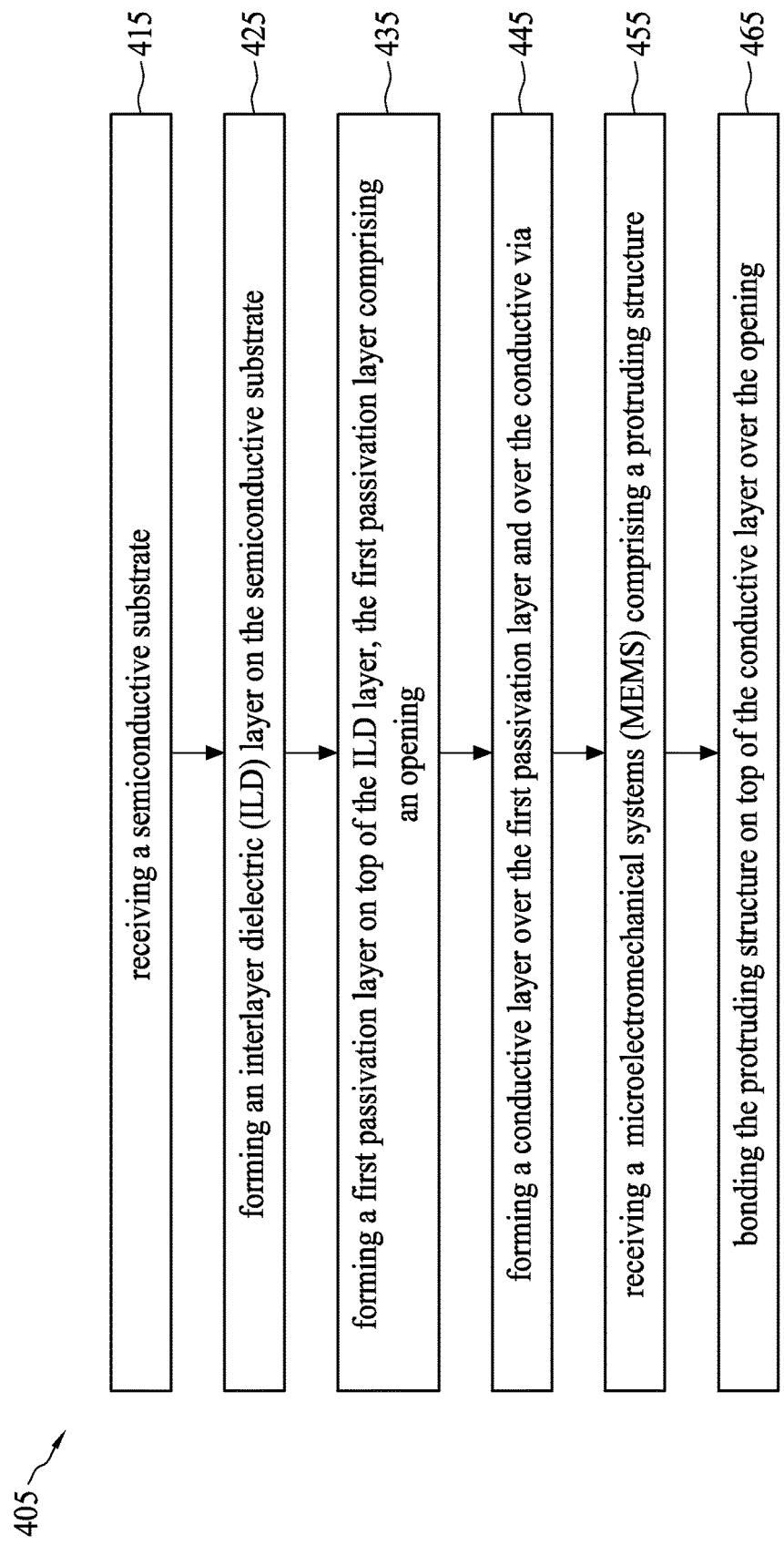
FIG. 16 is an operational flow of a method for manufacturing a MEMS, in accordance with some embodiments.
Figure 17:
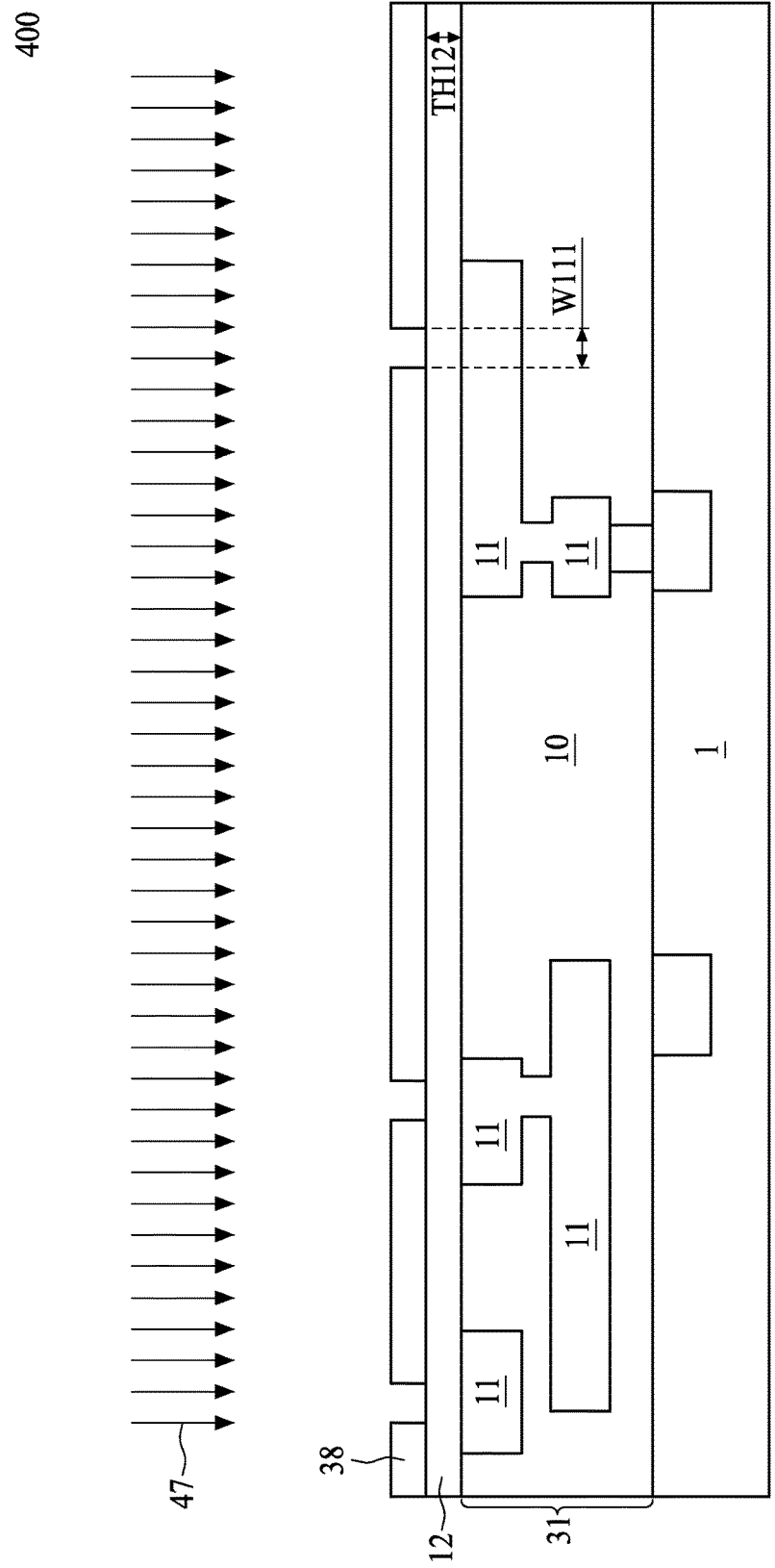
FIGS. 17 to 23 are cross sectional views of an operation in a method for manufacturing a MEMS, in accordance with some embodiments.
Figure 18:
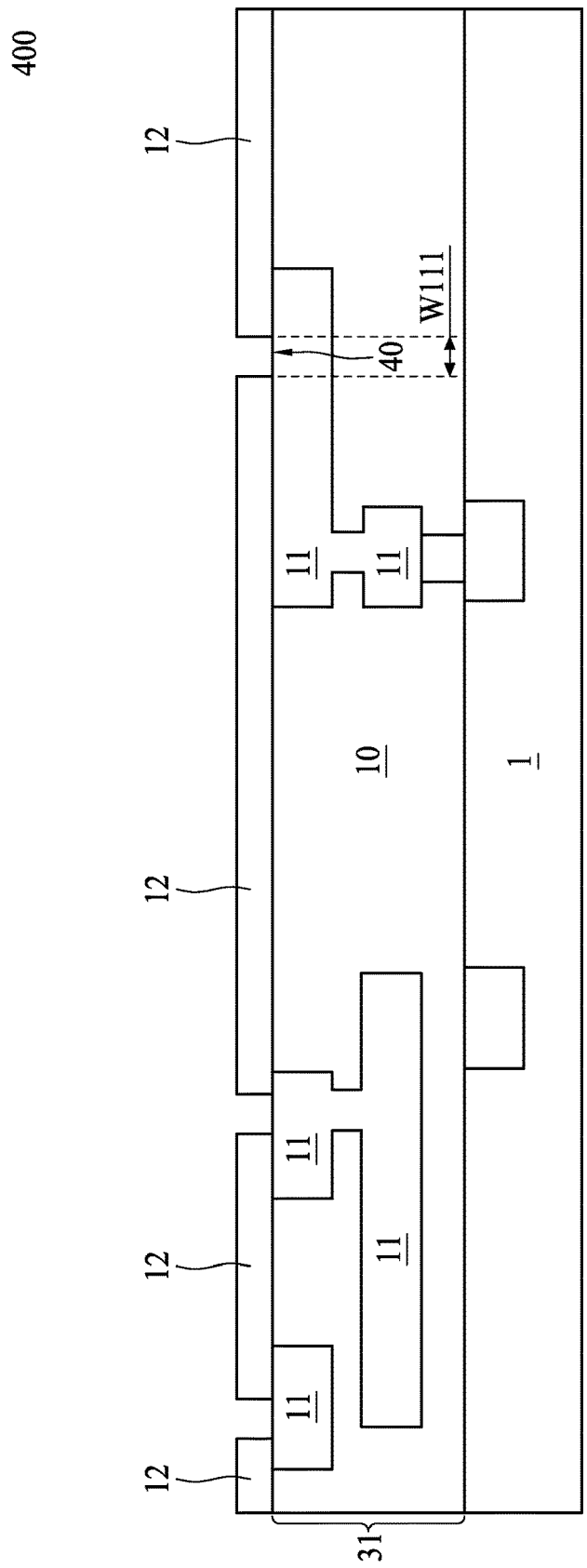
Figure 21:
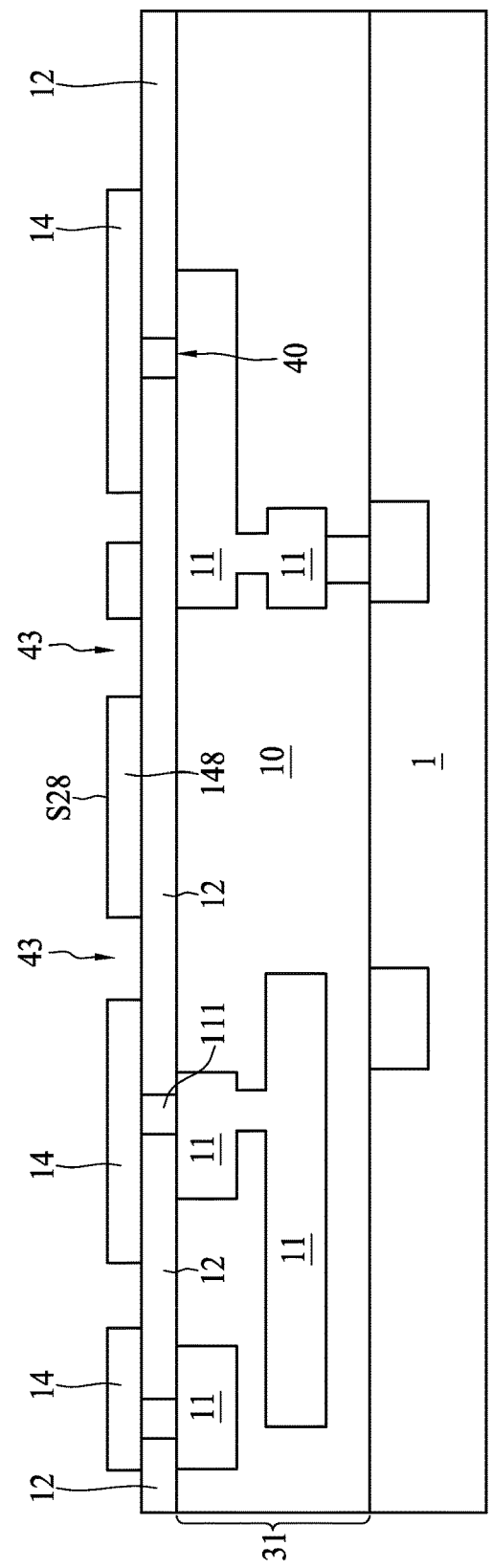
Figure 23:
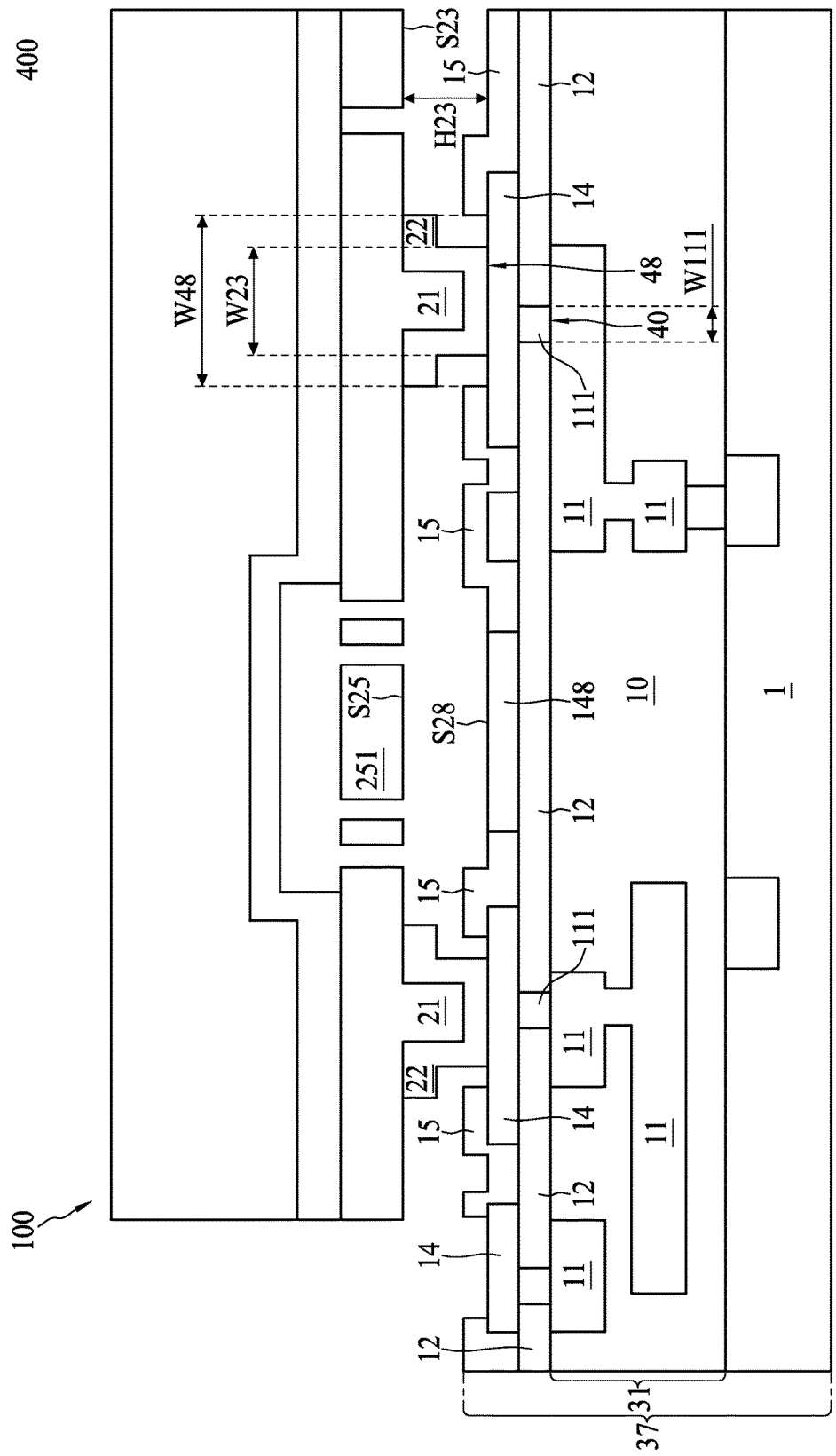

In FIG. 16, a method of manufacturing 405 is illustrated. FIG. 16 illustrates an operation flow for forming the image sensor 400 in FIG. 4. Operation 415 receives a semiconductive substrate 1. Some exemplary embodiments for operation 415 are illustrated in FIG. 17. Operation 425 forms an interlayer dielectric (ILD) layer 31 on the semiconductive substrate 1. Some exemplary embodiments for operation 425 are illustrated in FIG. 17. Operation 435 forms a first passivation layer 12 on top of the ILD layer 31, the first passivation layer 12 comprising an opening 40. Some exemplary embodiments for operation 435 are illustrated in FIG. 18. Operation 445 forms a conductive layer 14 over the first passivation layer 12 and over the conductive via 111. Some exemplary embodiments for operation 445 are illustrated in FIG. 21. Operation 455 receives a semiconductive block 100 comprising a protruding structure 23. Some exemplary embodiments for operation 455 are illustrated in FIG. 23. Operation 465 bonds the protruding structure 23 on top of the conductive layer 14 over the opening 40. Some exemplary embodiments for operation 465 are illustrated in FIG. 23.

FIG. 17 includes the semiconductive substrate 1 and the ILD layer 31 formed on top of the semiconductive substrate 1 similar to FIG. 6. The first passivation layer 12 is formed by any suitable deposition operation on top of the ILD layer 31. The resist 38 is patterned on top of the first passivation layer 12.

The first passivation layer 12 may be patterned to have the opening 40 in FIG. 4. The first passivation layer 12 may be formed using any suitable operation, including some operations described herein. In FIG. 17, in one example, a layer of photoresist such as the resist 38 is formed over first passivation layer 12 by a suitable operation, such as spin-on coating, and patterned to form a photoresist feature by a proper photolithography patterning method. The photoresist feature can then be transferred by the etching operation 47 to some underlying layers (i.e., the first passivation layer 12) to form the opening 40 in FIG. 4.

The photolithography operation may also be implemented or replaced by other proper methods such as maskless photolithography, electron-beam writing, ion-beam writing, and/or molecular imprint. In some embodiments, photolithography operation may include forming the photoresist layer over first passivation layer 12, exposing photoresist to a pattern, performing a post-exposure bake operation, and developing the resist 38 to form a masking element including the photoresist. The first passivation layer 12 may then be etched using reactive ion etching (RIE) operations and/or other etching operations. The etching operation 47 may include dry etching, wet etching, and/or other etching methods (e.g., reactive ion etching). The etching operation 47 may also be either purely chemical (plasma etching), purely physical (ion milling), and/or combinations thereof. The etching operation 47 removes some exposed portions of the first passivation layer 12 such that some portions of the conductive layer 11 underneath is exposed.

In some embodiments, the etching operation 47 is a selective etching. The selective etching may use an HBr and/or $Cl_2$ as some etch gases. In some embodiments, a bias voltage used in the etching operation may be adjusted to allow better control of an etching direction to attain desired etching profiles to form opening 40 in FIG. 18. In FIG. 17, in some embodiments, the etching operation 47 may include selective etching with slower etching rate for the underlying conductive layer 11 than for the first passivation layer 12. Different etchant may be used for etching different compositions of materials. Different combination of operation parameters for etching may be designed. In some embodiments, the selective etching may also use etchant that would attack first passivation layer 12 and not attack, or attack slower, the conductive layer 11 underneath. Some etching operations may include etching back operation. In FIG. 18, the opening 40 is formed to exposes the underlying conductive layer 11.

In some embodiments, the etching operation 47 includes wet etching or dry etching. The dry etching operation may be implemented in an etching chamber. Various dimensions of different features such as the thickness TH12 of the first passivation layer 12 or the width W111 in some embodiments may be controlled by adjusting some operation parameters including a radio frequency (RF) source power, a bias power, electrode size, a pressure, a flow rate, etching duration, a wafer temperature, other suitable operation parameters, and/or combinations thereof. A dry etching operation may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr, He and/or $CHBR_3$), iodine-containing gas, other suitable gases and/or plasmas, and/or combinations thereof. In some embodiments, the dry etching operation utilizes an $O_2$ plasma treatment and/or an $O_2/N_2$ plasma treatment. Further, the dry etching operation may be performed for a suitable duration.

Figure 19:
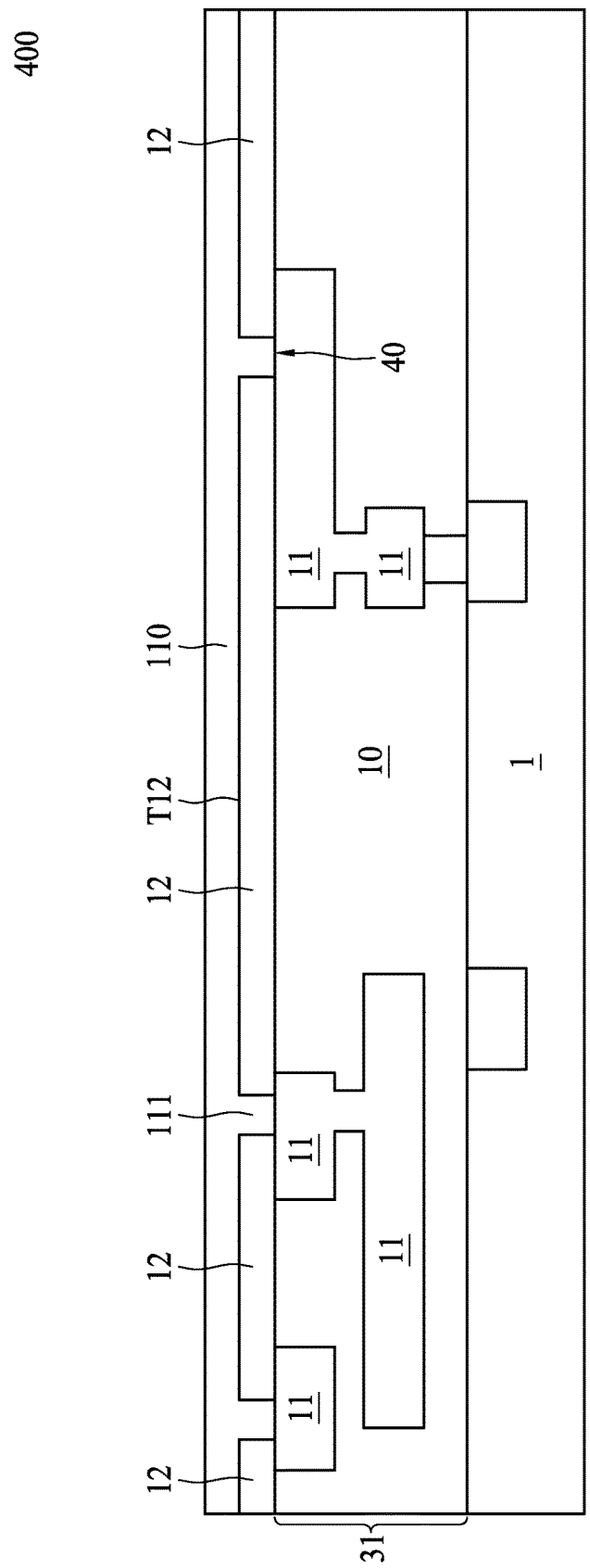

In FIG. 19, the conductive layer 110 is deposited over the conductive layer 11 in the opening 40 of the first passivation layer 12 to form the conductive via 111. The conductive via 111 and the conductive layer 110 are made of a conductive material similar to that of the conductive layer 11 or some other material. In some embodiments, the conductive via 111 includes the conductive material different from that of the conductive layer 14 in FIG. 4. The conductive via 111 can include the conductive material such as copper (Cu) or tungsten (W).

The opening 40 of the first passivation layer 12 is filled by the conductive material by a suitable deposition operation. In some embodiments, simultaneous deposition and etching may form the conductive layer 110. In some embodiments, additional deposition operations may be performed for additional layers. Some deposition operations may include chemical vapor deposition (CVD) or physical vapor deposition (PVD).

Figure 20:
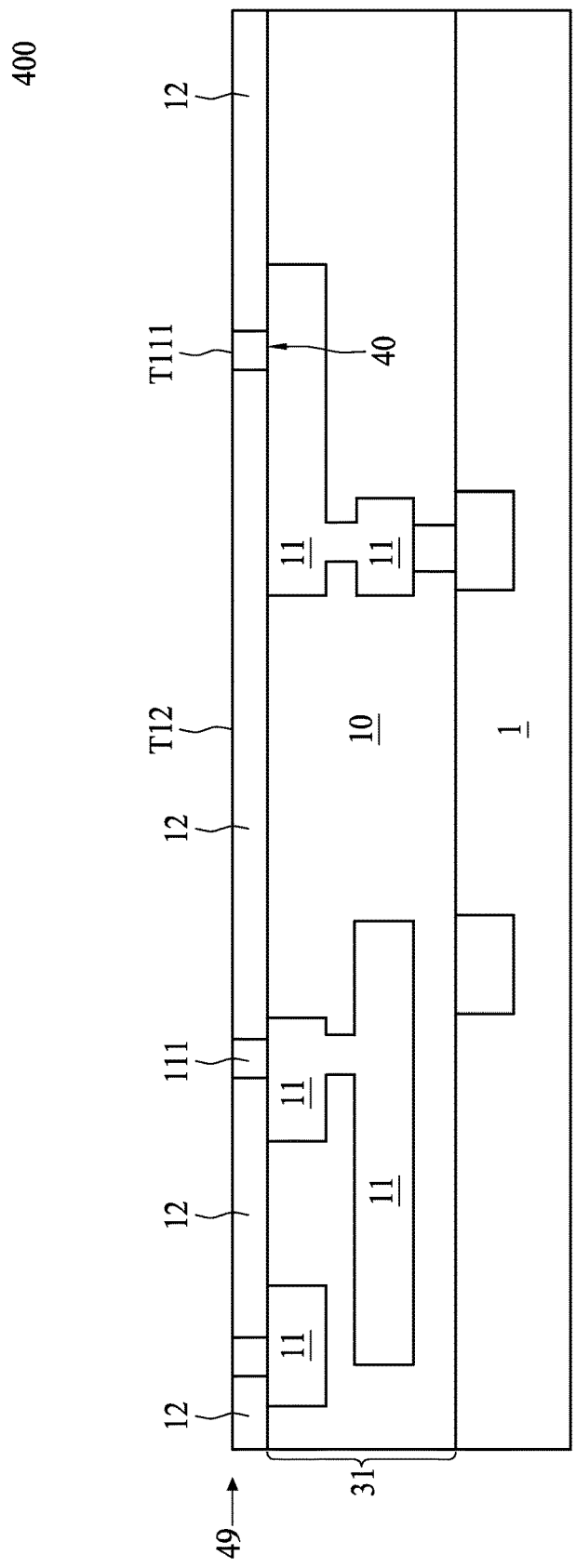

In FIG. 20, the CMP operation 49 lowers the conductive layer 110 over the first passivation layer 12 in FIG. 19. The conductive layer 110 is removed by the CMP operation 49 such that the top side T12 of the first passivation layer 12 and a top side T111 of the conductive via 111 are exposed. The top side T111 of the conductive via 111 is formed substantially coplanar with the top side T12 of the first passivation layer 12 by the CMP operation 49. The top side T111 of the conductive via 111 is substantially smooth and flat. The conductive via 111 is formed to be electrically coupled with the conductive layer 11 underneath. The conductive layer 11 can also be referred to as a conductive path in the ILD layer 31.

In FIG. 21, the conductive layer 14 is formed on top of the first passivation layer 12 and the conductive via 111. The conductive layer 14 is deposited over the top side T111 of the conductive via 111 such that the conductive via 111 is electrically coupled with the conductive layer 14. The conductive layer 14 is patterned to expose portions of the first passivation layer 12. The conductive layer 14 is patterned to form the sensing surface S28 similar to FIG. 12.

The conductive layer 14 is patterned such that the conductive layer 14 over the conductive via 111 remains covering on top of the conductive via 111. The conductive layer 14 includes the opening 43 to form the sensing surface S28. In some embodiments, the conductive layer 14 is formed near the peripheral to serve as a bonding pad.

Figure 22:
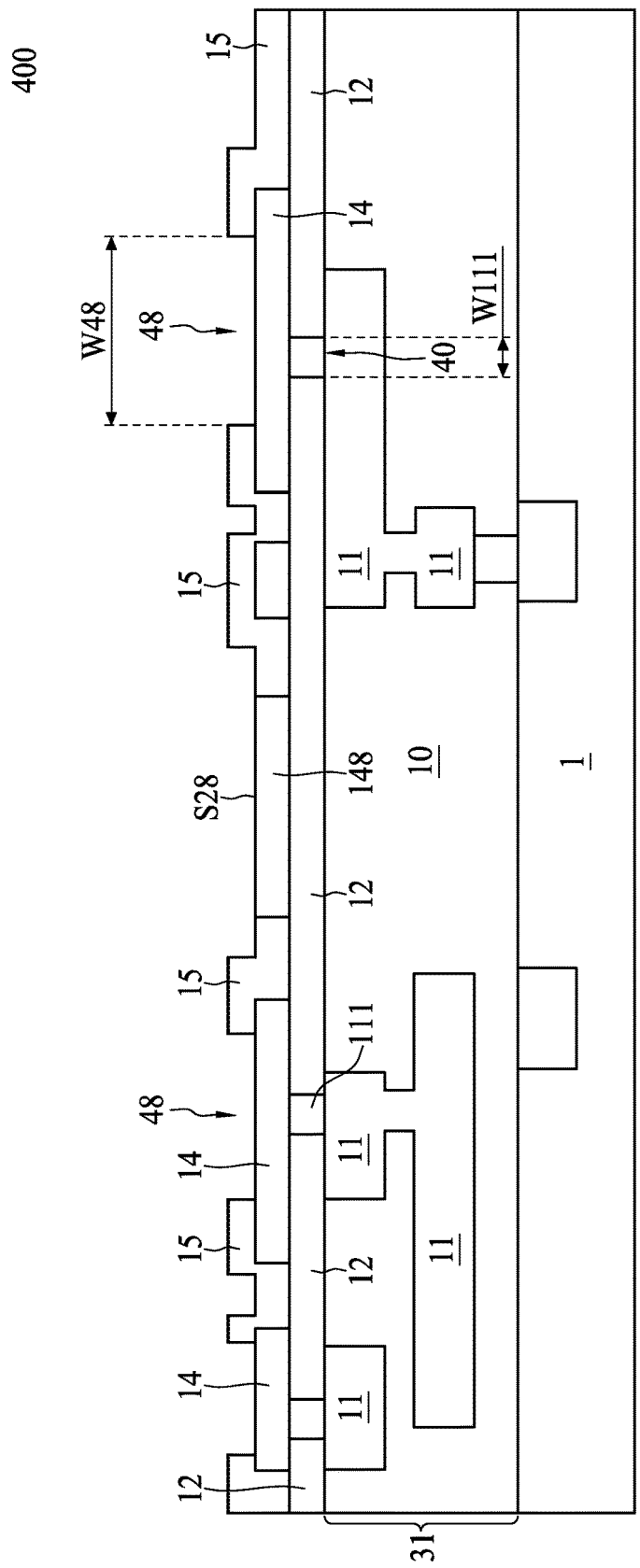

In FIG. 22, the second passivation layer 15 is formed partially over the conductive layer 14 and the first passivation layer 12. The second passivation layer 15 is blanket deposited over the conductive layer 14 and the first passivation layer 12. The second passivation layer 15 is patterned by suitable lithographic operations including etching to expose the sensing surface S28 similar to FIGS. 13 and 14.

A portion of the second passivation layer 15 over the portion 148 of the conductive layer 14 is removed such that no dielectric material is over the sensing surface S28. The second passivation layer 15 next to the portion 148 of conductive layer 14 is coplanar with the portion 148.

The second passivation layer 15 is patterned to form the opening 48 away from the sensing surface S28. In some embodiments, the etching operation includes a wet etching operation. The wet etching operation may utilize a hydrofluoric acid (HF) solution for a HF dipping operation. In some embodiments, the wet etching operation may apply a diluted hydrofluoric acid to an intermediate semiconductor structure. In some embodiments, the wet etching operation includes exposing to a hydroxide solution containing ammonium hydroxide, diluted HF, deionized water, and/or other suitable etchant solutions.

FIG. 22 is similar to FIG. 14 except that in FIG. 22, the opening 48 of the second passivation layer 15 is formed over the conductive via 111 inside the opening 40. In some embodiments, in FIG. 23, the opening 48 includes a width W48 substantially greater than a width W111 of the conductive via 111. In some embodiments, the width W48 is greater than the width W23 of the protruding structure 23 in FIG. 4.

In FIG. 23, the semiconductive block 100 is coupled to the sensing electrode 37. FIG. 23 is similar to FIG. 15 except that the protruding structure 23 is disposed over the conductive via 111. The protruding structure 23 is fitted inside the opening 48 and bonded with the conductive layer 14 by a heating operation. FIG. 23 is similar to FIG. 9 or FIG. 15, except that in FIG. 23 and FIG. 15, the bonding between the layer 22 and the conductive layer 14 can be a Ge—AlCu bonding formed under a higher temperature than the predetermined temperature used to bond the Cu—Sn bonding in FIG. 9. The MEMS 100 is bonded to the sensing electrode 37 such that the surface S23 is over the sensing surface S28 by the height H23.

Some embodiments of the present disclosure provide a microelectromechanical systems (MEMS). The MEMS includes a semiconductive block. The semiconductive block includes a protruding structure. The protruding structure includes a bottom surface. The semiconductive block includes a sensing structure. A semiconductive substrate includes a conductive region. The conductive region includes a first surface under the sensing structure. The first surface is substantially coplanar with the bottom surface. A dielectric region includes a second surface not disposed over the first surface.

Some embodiments of the present disclosure provide a microelectromechanical systems (MEMS). The MEMS includes a semiconductive block. The semiconductive block includes a protruding structure. The protruding structure includes a bottom surface. The semiconductive block includes a sensing structure. A semiconductive substrate includes a conductive layer. The conductive layer includes a first surface under the sensing structure. The first surface is substantially coplanar with the bottom surface. An upper passivation layer includes a second surface adjacent to the first surface. A lower passivation layer is under the conductive layer and the upper passivation layer. The lower passivation layer includes an opening not under the sensing structure.

Some embodiments of the present disclosure provide a method of manufacturing a microelectromechanical systems (MEMS). The method includes: receiving a semiconductive substrate; forming a conductive layer over the semiconductive substrate, the conductive layer comprising a sensing surface; forming a dielectric layer over the conductive layer; removing a portion of the dielectric layer over the sensing surface such that the sensing surface is exposed; receiving a semiconductive block comprising a sensing structure over the sensing surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS), comprising:
    a semiconductive block, comprising:
        a plurality of protruding structures, each of the protruding structures comprising a bottom surface; and
        a sensing structure between at least one pair of adjacent protruding structures, the sensing structure comprising a sensing piece and a spring structure between the sensing piece and one of the plurality of protruding structures;
    a sensing electrode disposed against the semiconductive block, comprising:
        a semiconductive substrate comprising a surface facing the semiconductive block; and
        a conductive region between the surface of the semiconductive substrate facing the semiconductive block and the semiconductive block, comprising:
            a first surface directly under the sensing piece and the spring structure, and
            a second surface under a projection of the protruding structures, the second surface bonding with the bottom surface of one of the plurality of the protruding structures, a top of the first surface and a top of the second surface being laterally aligned; and
        a dielectric layer over the semiconductor substrate, a top surface the dielectric layer being a dielectric surface laterally abutting the first surface.

2. The MEMS of claim 1, wherein the dielectric layer comprises an interlayer dielectric (ILD) layer.

3. The MEMS of claim 2, wherein the dielectric layer further comprises a first passivation layer, the first passivation layer comprising a top above the bottom surface.

4. The MEMS of claim 1, wherein the conductive region comprises a third surface not under the sensing structure, and the protruding structure comprises an outer layer bonded with the third surface, the outer layer comprising tin (Sn), and the conductive region comprising copper.

5. The MEMS of claim 1, further comprising a region over the first surface, and the region being void of a dielectric material.

6. The MEMS of claim 1, wherein the conductive region comprises aluminum copper.

7. The MEMS of claim 3, further comprising a second passivation layer under the conductive region, the first passivation layer, and the protruding structure.

8. A microelectromechanical systems (MEMS), comprising:
a semiconductive block, comprising:
a plurality of protruding structures, each comprising a bottom surface; and
a sensing structure between adjacent protruding structures;
a sensing electrode disposed against the semiconductive block, comprising:
a semiconductive substrate;
a conductive layer comprising:
a first surface under a projection of the sensing structure, and
a second surface under a projection of the protruding structures, the second surface bonding with the bottom surface of one of the plurality of protruding structures;
an upper passivation layer comprising a top surface coplanar with the first surface; and
a lower passivation layer under the first surface of conductive layer and the upper passivation layer, the lower passivation layer comprising a through opening,
wherein the conductive layer fills the through opening of the lower passivation layer, and the first surface is laterally abutting the top surface of the upper passivation layer.

9. The MEMS of claim 8, further comprising a region over the first surface and under the sensing structure, the region being void of a dielectric material.

10. The MEMS of claim 9, wherein the upper passivation layer is partially over the conductive layer outside of the region.

11. The MEMS of claim 8, further comprising a conductive via in the through opening under the protruding structure, the conductive via comprising a material different from that of the conductive layer.

12. The MEMS of claim 8, further comprising a conductive via in the through opening and a conductive path under the conductive via, the conductive via comprising a material similar to that of the conductive path.

13. The MEMS of claim 8, wherein the through opening comprising a first width, the protruding structure comprising a second width, the second width being greater than the first width.

14. The MEMS of claim 8, wherein the conductive layer comprises a recessed portion and a third surface, the third surface connected with the bottom surface being laterally distanced from the recessed portion.

15. A microelectromechanical systems (MEMS), comprising:
a semiconductive block, comprising:
a plurality of protruding structures, each comprising a bottom surface; and
a sensing structure between adjacent protruding structures, the sensing structure comprising a sensing piece and a spring structure between the sensing piece and one of the plurality of protruding structures; and
a sensing electrode disposed against the semiconductive block, comprising:
a semiconductive substrate comprising a top surface facing the semiconductive block; and
a conductive region between the surface of the semiconductive substrate facing the semiconductive block and the semiconductive block, comprising:
a first conductive surface directly under-the sensing piece and the spring structure; and
a second conductive surface under a projection of the protruding structures,
wherein the top surface, the first conductive surface, and the second conductive surface are coplanar, and the top surface is laterally joining with the first conductive surface and the second conductive surface,
wherein the bottom surface is in contact with the second conductive surface of the conductive region.

16. The MEMS of claim 15, wherein the bottom surface comprises tin.

17. The MEMS of claim 16, wherein the first conductive surface comprises copper.

18. The MEMS of claim 15, further comprising a first passivation layer on the top surface, the first passivation layer comprising a top higher than the bottom surface of the protruding structure.

19. The MEMS of claim 15, wherein a length of the sensing structure is greater than a length of the first conductive surface.

* * * * *